US012707833B2

(12) United States Patent
Lee et al.

(10) Patent No.: US 12,707,833 B2
(45) Date of Patent: Aug. 11, 2026

(54) DISPLAY PANEL HAVING TEST CIRCUIT AND DISPLAY DEVICE INCLUDING THE SAME

(71) Applicant: Samsung Display Co., Ltd., Yongin-si (KR)

(72) Inventors: Donghyun Lee, Asan-si (KR); Si Joon Song, Suwon-si (KR); Sanghyuck Yoon, Seoul (KR); Jaehak Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 726 days.

(21) Appl. No.: 18/164,015

(22) Filed: Feb. 3, 2023

(65) Prior Publication Data

US 2023/0292564 A1 Sep. 14, 2023

(30) Foreign Application Priority Data

Mar. 10, 2022 (KR) ........................ 10-2022-0030138

(51) Int. Cl.

| | |
|---|---|
| ***H10K 59/131*** | (2023.01) |
| ***G09G 3/00*** | (2006.01) |
| ***H10K 59/80*** | (2023.01) |
| ***H10K 71/70*** | (2023.01) |
| ***H10K 102/00*** | (2023.01) |

(52) U.S. Cl.

CPC ........... *H10K 59/131* (2023.02); *G09G 3/006* (2013.01); *H10K 59/873* (2023.02); *H10K 71/70* (2023.02); *G09G 2330/06* (2013.01); *G09G 2330/12* (2013.01); *H10K 2102/311* (2023.02)

(58) Field of Classification Search

CPC .. H10K 71/70; H10K 2102/131; H10K 59/13; H10K 59/873; G09G 3/006; G09G 2330/06; G09G 2330/12

USPC ................................ 257/40, 59, 91, 99, 100

See application file for complete search history.

(56) References Cited

U.S. PATENT DOCUMENTS

| | | | | |
|---|---|---|---|---|
| 5,777,610 | A | 7/1998 | Sugimoto et al. | |
| 7,123,230 | B2 * | 10/2006 | Park | G09G 3/3688 345/95 |
| 7,342,354 | B2 * | 3/2008 | Utsunomiya | H10D 86/0214 313/506 |
| 8,159,443 | B2 * | 4/2012 | Lai | G09G 3/006 345/55 |

(Continued)

FOREIGN PATENT DOCUMENTS

| | | |
|---|---|---|
| CN | 108564886 A | 9/2018 |
| JP | 2007171993 A | 7/2007 |

(Continued)

*Primary Examiner* — Eric W Jones

(74) *Attorney, Agent, or Firm* — CANTOR COLBURN LLP

(57) ABSTRACT

A display panel includes a base layer including a first region, and a second region which is adjacent to the first region, a pixel disposed on the first region of the base layer, a line electrically connected to the pixel and extending from the first region to the second region, a pad electrically connected to the line, at which an electrical signal is input to the display panel from outside thereof and disposed under a top surface of the base layer, and a test circuit on the base layer, in the second region, the test circuit being spaced apart from the first region and further from the first region than the pad.

20 Claims, 17 Drawing Sheets

(56) References Cited

U.S. PATENT DOCUMENTS 8,222,666 B2 * 7/2012 Hatano ................ H10H 20/857 257/E33.053
9,341,873 B2 * 5/2016 Chen .................... H10K 59/131
9,454,025 B2 * 9/2016 Zhong ..................... G06F 3/044
10,096,621 B2 * 10/2018 Yanaka .............. H10D 86/0214
10,170,530 B2 * 1/2019 Sano ...................... H10K 77/10
10,211,233 B2 * 2/2019 Kawata ............... G02F 1/13452
10,403,703 B2 * 9/2019 Yamazaki ............ H10K 59/131
10,446,755 B2 * 10/2019 Kwak .................. H10K 59/131
10,490,504 B2 * 11/2019 Jo ......................... G02F 1/1345
10,566,554 B2 2/2020 Li et al.
10,916,619 B2 * 2/2021 Seo ........................ H10D 86/60
10,997,881 B2 5/2021 Shin et al.
11,051,405 B2 * 6/2021 Hwu .................... H10K 59/131
11,353,999 B2 6/2022 Kim et al.
11,669,181 B2 * 6/2023 Sakuishi ................ H10K 59/40 345/174
11,839,120 B2 * 12/2023 Chen .................... H10K 59/131
2003/0173890 A1 * 9/2003 Yamazaki ........... G02F 1/16766 313/498
2004/0245924 A1 * 12/2004 Utsunomiya ...... H10D 86/0214 313/506
2006/0279510 A1 * 12/2006 Lai ......................... G09G 3/006 345/100
2009/0206334 A1 * 8/2009 Yoon .................... H10K 59/131 257/E23.002
2010/0148209 A1 * 6/2010 Hatano .................. H10K 71/60 257/E33.053
2011/0043500 A1 * 2/2011 Kwak .................. G09G 3/3208 345/206
2011/0050660 A1 * 3/2011 Kim ....................... G09G 3/006 345/205
2012/0140424 A1 * 6/2012 Sato .................. G02F 1/133305 257/E29.273
2013/0335397 A1 * 12/2013 Kim ..................... G09G 3/3233 345/82
2014/0375916 A1 * 12/2014 Chen .................... H10D 86/411 349/33
2015/0243242 A1 * 8/2015 Eom ........................ G09G 5/00 345/211
2015/0255527 A1 * 9/2015 Oooka ................... G09G 3/006 438/18
2015/0372065 A1 * 12/2015 Yamazaki ............ H10K 59/131 257/89
2016/0104402 A1 * 4/2016 Kim ....................... G09G 3/006 324/762.07
2016/0300853 A1 * 10/2016 Yamazaki .............. G09G 3/035
2016/0321972 A1 * 11/2016 Kang ................... G09G 3/3225
2017/0179159 A1 * 6/2017 Kawata .................. H10D 86/60
2017/0338250 A1 * 11/2017 Yanaka .................. H10K 71/80
2018/0158837 A1 * 6/2018 Lee ...................... H10D 86/441
2018/0182274 A1 * 6/2018 Jung ...................... G09G 3/006
2018/0269269 A1 * 9/2018 Kim ........................ H01L 24/73
2019/0088584 A1 * 3/2019 Won .................. H01L 23/49838
2019/0163304 A1 * 5/2019 Shim .................... G09G 3/3233
2019/0267572 A1 * 8/2019 Wang ................... H10K 71/231
2019/0280074 A1 * 9/2019 Li .......................... G09G 3/006
2019/0348478 A1 * 11/2019 Kim ....................... G09G 3/006
2019/0392741 A1 * 12/2019 Cho ....................... G09G 3/006
2020/0176547 A1 * 6/2020 Seo ........................ H10D 86/40
2021/0181916 A1 * 6/2021 Kwon .................... H10K 59/40
2021/0202663 A1 * 7/2021 Yang .................. H10K 59/1213
2021/0366330 A1 * 11/2021 Huang ................. G09G 3/2092
2022/0115463 A1 * 4/2022 Han ..................... H10K 59/124

FOREIGN PATENT DOCUMENTS

| | | | |
|---|---|---|---|
| KR | 100144283 | B1 | 7/1998 |
| KR | 1020190007570 | A | 1/2019 |
| KR | 1020190068112 | A | 6/2019 |
| KR | 20210145026 | A | 12/2021 |

* cited by examiner

100a
CBDL
SGL
DA,110A1
ESD1
AR1-1
NC1-1
NC2-1
AR2-1
AR3-1
AR4-1
MCL-1
AR5-1
NDA,110A2
NC3-1
AR6-1
ESD2
AR7-1
TEL
AR8-1
TSC
110

DISPLAY PANEL HAVING TEST CIRCUIT AND DISPLAY DEVICE INCLUDING THE SAME

This application claims priority to Korean Patent Application No. 10-2022-0030138 filed on Mar. 10, 2022, and all the benefits accruing therefrom under 35 U.S.C. § 119, the disclosures of which are incorporated by reference herein in their entireties.

BACKGROUND

(1) Field

Embodiments of the present disclosure described herein relate to a display panel and a display device including the same.

(2) Description of the Related Art

Various display devices have been developed to be employed for multi-media devices such as a television, a cellular phone, a navigation system, or a tablet personal computer. Studies and research have been conducted to reduce a region, in which an image is not displayed, from a display device, to meet market demand. In addition, study and research have been conducted to enlarge a display region in a display device for displaying an image to outside the display device, such as to a user.

SUMMARY

Embodiments of the present disclosure provide a display panel including a non-display region having a reduced area, and a display device including the same.

According to an embodiment of the present disclosure, a display panel includes a base layer including a first region and a second region defined in the base layer, a plurality of pixels on the first region of the base layer, a plurality of lines electrically connected to the plurality of pixels and extending from the first region to the second region, a plurality of pads electrically connected to the plurality of lines, respectively, and under a top surface of the base layer, and a test circuit on the base layer, and spaced apart from the plurality of pixels while interposing the plurality of pads between the plurality of pixels and the test circuit.

The base layer may include a first sub-base layer, a second sub-base layer on the first sub-base layer, and a conductive layer extended along and between the first sub-base layer and the second sub-base layer.

A plurality of first connection lines may be further included to be electrically connected to the plurality of lines and to pass through the second sub-base layer. Each of the plurality of first connection lines may be electrically connected to the conductive layer.

The conductive layer may include the plurality of pads, and the plurality of first connection lines may be electrically connected to the plurality of pads.

The conductive layer may include the plurality of pads, a plurality of second connection lines connected to the plurality of pads, and a plurality of contact parts connected to the plurality of second connection lines, respectively. The plurality of contact parts may make contact with the plurality of first connection lines.

The plurality of pads may be arranged in a first direction. Each of the plurality of pads may include a first end and a second end spaced apart from each other in a second direction crossing the first direction. Each of the plurality of second connection lines may protrude while extending from the first end of a relevant pad of the plurality of pads.

The plurality of pads may be arranged in a first direction. Each of the plurality of pads may include a first end and a second end spaced apart from each other in a second direction crossing the first direction. Some second connection lines of the plurality of second connection lines may protrude while extending from the first end of a relevant pad of the plurality of pads. Remaining second connection lines of the plurality of second connection lines may protrude while extending from the second end of a relevant pad of the plurality of pads.

When viewed from a plan view, the first end may be farther from a first region than the second end, each of the plurality of second connection lines may have a contact part making contact with the relevant first connection line of the plurality of first connection lines. A contact part of each of the remaining second connection lines may be spaced apart in the first direction from a region for the plurality of pads.

The plurality of first connection lines may make direct contact with the plurality of pads.

The plurality of pads may be in the second region.

An encapsulating layer may be further included to cover the plurality of pixels. When viewed from a plan view, the plurality of pads may be overlapped with an end of the encapsulating layer.

The plurality of pads may be in the first region. When viewed from a plan view, the plurality of pads may be overlapped with some of the plurality of pixels.

The base layer may include a first surface and a second surface opposite to the first surface. The plurality of lines may be on the first surface of the base layer. The plurality of pads may be in a hole of the base layer formed through the first surface from the second surface. The plurality of pads may be connected to the plurality of lines through the hole formed through the first surface from the second surface.

The display panel may further include a first electrostatic discharge protection circuit between the first region and the test circuit, when viewed from a plan view, a plurality of contact parts between the first electrostatic discharge protection circuit and the test circuit to electrically connect the plurality of lines to the plurality of pads, when viewed from a plan view, and a second electrostatic discharge protection circuit between the plurality of contact parts and the test circuit, when viewed from a plan view.

According to an embodiment of the present disclosure, the display device includes a display panel to display an image, and a circuit film electrically connected to the display panel. The display panel may include a base layer having a first region and a second region defined in the base layer, a plurality of pixels on the first region of the base layer, a plurality of lines on a top surface of the base layer, electrically connected to the plurality of pixels, and extending from the first region to the second region, a plurality of pads under the top surface of the base layer and electrically connected to the plurality of lines, a plurality of contact parts electrically connected to the plurality of lines and the plurality of pads, and a plurality of test extension lines extending from the plurality of contact parts in a direction away from the first region. The circuit film may be under the base layer and may be coupled to the plurality of pads.

The display panel may further include a test circuit on the base layer and electrically connected to the plurality of test extension lines. A partial region of the display panel may be folded between a region for the plurality of contact parts and a region for the test circuit.

The base layer may include a first sub-base layer, a second sub-base layer on the first sub-base layer, and a conductive layer between the first sub-base layer and the second sub-base layer. The display panel may further include a plurality of first connection lines electrically connected to the plurality of lines, respectively, and passing through the second sub-base layer. The conductive layer may include the plurality of pad, and the plurality of first connection lines may be electrically connected to the plurality of pads.

The conductive layer may further include a plurality of second connection lines electrically connected to the plurality of pads, respectively. The plurality of second connection lines may make contact with the plurality of first connection lines.

Each of the plurality of pads may be at least partially overlapped with the first region.

An end of the base layer may be aligned with the end of each of the plurality of test extension lines.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
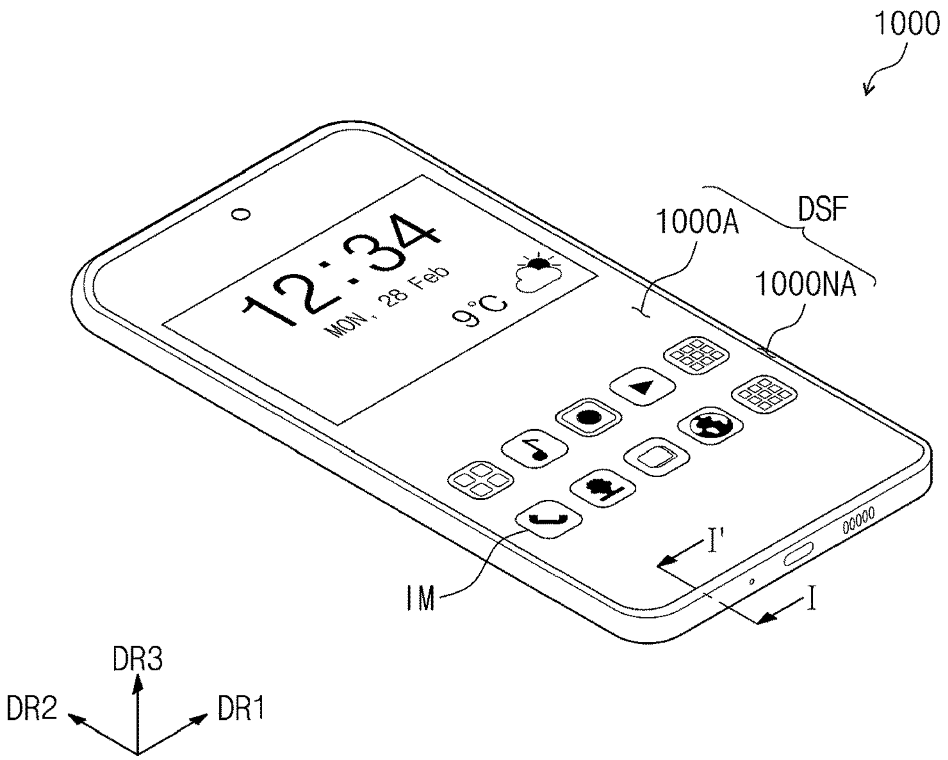
FIG. 1 is a perspective view of a display device, according to an embodiment of the present disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, the expression that a first component (or region, layer, part, portion, etc.) is related such as being "on", "connected with", or "coupled to" a second component means that there is no third component therebetween or means that a third component is disposed therebetween. In contrast, the expression that a first component (or region, layer, part, portion, etc.) is related such as directly "on", directly "connected with", or directly "coupled to" a second component means that there is no third component therebetween. In a 'direct' relationship, elements may form an interface therebetween, without being limited thereto.

The same reference numeral refers to the same component. As used herein, a reference numeral may indicate a singular element or a plurality of the element. For example, a reference numeral labeling a singular form of an element within the drawing figures may be used to reference a plurality of the singular element within the text of specification.

In addition, in drawings, thicknesses, proportions, and dimensions of components may be exaggerated to describe the technical features effectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The expression "and/or" includes one or more combinations which associated components are capable of defining.

Although the terms "first", "second", etc. may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The singular forms are intended to include the plural forms unless the context clearly indicates otherwise.

In addition, the terms "under", "below", "on", "above", etc. are used to describe the correlation of components illustrated in drawings. The terms that are relative in concept are described based on a direction shown in drawings.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to accompanying drawings.

FIG. 1 is a perspective view of a display device 1000 according to an embodiment of the present disclosure.

Referring to FIG. 1, the display device 1000 may refer to a device which is activated in response to an electrical signal (e.g., an electronic device). For example, the display device 1000 may be a cellular phone, a tablet PC, a car navigation system, a game console, or a wearable device, but is not limited thereto. FIG. 1 illustrates that the display device 1000 is the cellular phone.

The display device 1000 may include a display surface DSF defined by a first direction DR1 and a second direction DR2 which crosses the first direction DR1. The display surface DSF may be in or parallel to a plane defined by the first direction DR1 and the second direction DR2 crossing each other. The display device 1000 may provide an image IM to outside the display device 1000 (i.e., to a user) through the display surface DSF. The display surface DSF may include a display region 1000A and a non-display region 1000NA which is adjacent to the display region 1000A, such as being around the display region 1000A in a plan view. The display region 1000A may display the image IM, and the non-display region 1000NA may not display the image IM. The non-display region 1000NA may surround the display region 1000A in the plan view. However, the present disclosure is not limited thereto, and the form or shape of the display region 1000A and the form of the non-display region 1000NA may be variously changed, may be deformable to be deformed, etc. Various components or layers of the display device 1000 may include a display region 1000A and a non-display region 1000NA corresponding to those described above.

According to the present disclosure, the area (e.g., a planar area along a plane) of the non-display region 1000NA may be reduced or minimized, with respect to an overall planar area of the display device 1000. Accordingly, the ratio of an area occupied by the display region 1000A to the whole area of the display surface DSF may be increased. Accordingly, the display device 1000 reduced in bezel width (e.g., at the non-display region 1000NA may be provided. The details thereof will be described below.

Hereinafter, a direction substantially perpendicular to a plane defined by the first direction DR1 and the second direction DR2 is defined as a third direction DR3. The third direction DR3 serves as a reference for distinguishing a front surface and a rear surface of each member, or a reference for defining a thickness of various components or layers of the display device 1000 (e.g., a thickness direction). In the present specification, "on a plane" or "in a plan view" may be defined as a view viewed along the third direction DR3. Hereinafter, the first to third directions DR1, DR2, and DR3 are directions indicated by the first to third direction axes, respectively, and the directions indicated by the first to third direction axes may be assigned with the same reference numerals.

Figure 2:
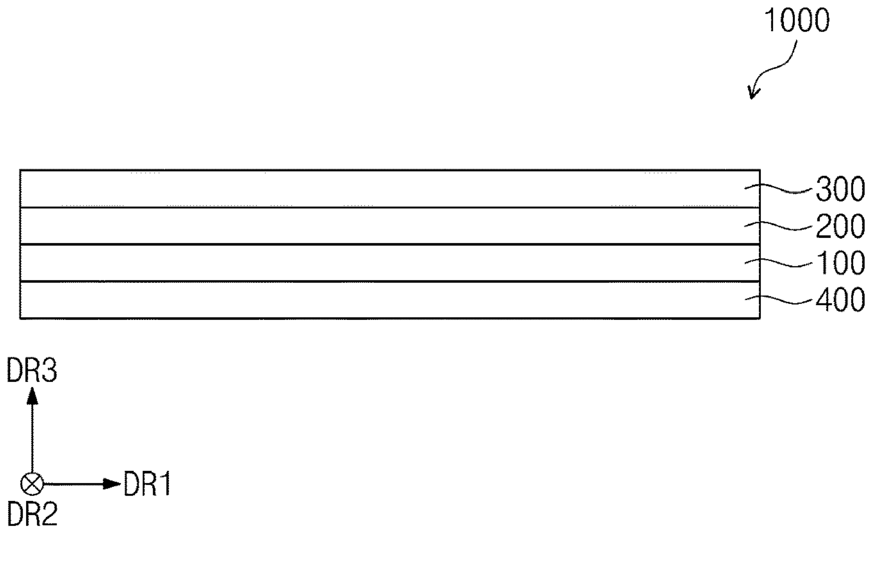
FIG. 2 is a cross-sectional view schematically illustrating a display device according to an embodiment of the present disclosure.

FIG. 2 is a cross-sectional view schematically illustrating the display device 1000 according to an embodiment of the present disclosure.

Referring to FIG. 2, the display device 1000 may include a display panel 100, an optical film 200, a window 300, and a lower film 400. The display device 1000 may include a structure in which the lower film 400, the display panel 100, the optical film 200 and the window 300 are sequentially stacked, in order, along the third direction DR3. According to an embodiment of the present disclosure, some of the above components may be omitted, and another component may be additionally added. An adhesive layer (not shown) may be disposed between the members if necessary. The adhesive layer may be an optically clear adhesive (OCA) layer or a pressure sensitive adhesive (PSA) film, but is not limited thereto. In addition, the adhesive layers described below may include the same material and a typical adhesive.

The display panel 100 may display an image IM(see FIG. 1), emit light, etc. and may sense an external input applied from the outside (e.g., outside of the display panel 100 and/or outside of the display device 1000). The external input may include various inputs applied from an outside of the display device 1000. For example, as well as a contact by an input tool, for example, a body part of a user, the external input may include a non-contact external input (for example, a hovering) which is applied in a state where the input tool approaches the display device 1000 or is adjacent to the display device 1000 within a given distance to be in sensing proximity of the display device 1000. In addition, the external input or input tool may be a force, a pressure, a temperature, and/or a light. The external input may be provided by a separate device, for example, an active pen or a digitizer pen as the input tool.

The optical film 200 may reduce reflectance of light incident on the optical film 200 from the outside. The optical film 200 may include a phase retarder and/or a polarizer. The optical film 200 may include at least a polarizing film. In this case, the optical film 200 may be attached to the display panel 100 through an adhesive layer.

Alternatively, the optical film 200 may include color filters. The color filters may have a specific arrangement. The arrangement of the color filters may be determined based on colors of light emitting from pixels PX (see FIG. 3) included in the display layer DPL (see FIG. 3), where the image IM is generated or displayed, light is generated or emitted, etc. by the pixels PX as a display element. In addition, the optical film 200 may further include a black matrix adjacent to the color filters. In this case, the adhesive layer may be omitted between the optical film 200 and the display panel 100.

Alternatively, the optical film 200 may include a destructive interference structure. For example, the destructive interference structure may include a first reflective layer and a second reflective layer which are disposed at mutually different layers within the optical film 200. First reflective light and second reflective light reflected at the first reflective layer and the second reflective layer, respectively, may destructive-interfere with each other, such that the reflective index of external light is reduced. In this case, the adhesive layer may be omitted between the optical film 200 and the display panel 100.

The window 300 may be disposed on the optical film 200. The window 300 may include an optically transparent material, such that the image IM is transmitted from the display panel 100, through the window 300, and to outside the display device 1000. For example, the window 300 may include glass or plastic. The window 300 may have a multi-layer structure or a single-layer structure. For example, the window 300 may include a plurality of plastic films bonded to each other by an adhesive or may have a glass substrate and a plastic film bonded to each other by the adhesive.

The lower film 400 may be disposed under the display panel 100. The lower film 400 may face the optical film 200 and/or the window 300 along the thickness direction, with the display panel 100 therebetween. For example, the lower film 400 may be a protective layer which blocks or absorbs light incident on the display panel 100. For example, the lower film 400 may be a colored film. However, the present disclosure is not specifically limited thereto.

Figure 3:
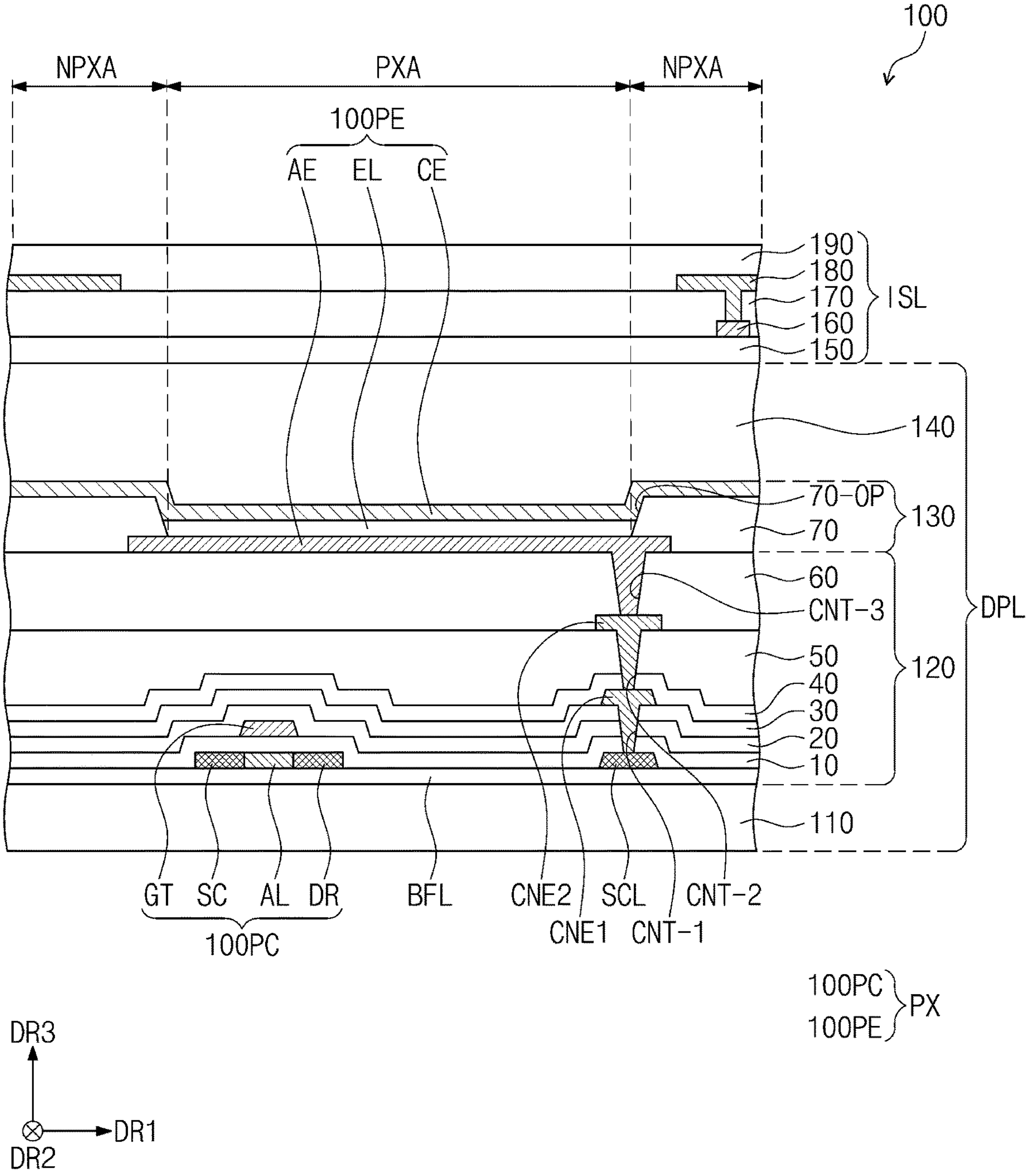
FIG. 3 is a cross-sectional view of a display panel according to an embodiment of the present disclosure.

FIG. 3 is a cross-sectional view of the display panel 100 according to an embodiment of the present disclosure.

Referring to FIG. 3, the display panel 100 may include a display layer DPL and a sensor layer ISL disposed on the display layer DPL. The display layer DPL may be configured to generate an image IM (see FIG. 1) as a display element layer. The display layer DPL may be a light emitting display layer which generates and/or emits light to display the image IM. For example, the display layer DPL may be an organic light emitting display layer, a quantum dot display layer, a micro-LED display layer, or a nano-LED display layer. The sensor layer ISL may be disposed on the display layer DPL. The sensor layer ISL may be disposed following the display layer DPL, in a light emitting direction of the display layer DPL, without being limited thereto. The sensor layer ISL may sense an external input applied from the outside. The sensor layer ISL may be an external sensor as a separate element from the display layer DPL, which is attached to the display layer DPL, or may be an integral-type sensor formed (or provided) subsequently during the manufacturing process of the display layer DPL by using the display layer DPL as a base on which the sensor layer ISL is provided.

The display layer DPL may include a base layer 110 (e.g., a first base layer), a circuit layer 120, a light emitting device layer 130, and an encapsulating layer 140.

The base layer 110 may be a member which provides a base surface on which the circuit layer 120 is disposed. The base layer 110 may have a synthetic resin layer. The synthetic resin layer may be a polyimide-based resin layer, and the material of the synthetic resin layer is not specifically limited. The base layer 110 may include a glass substrate, a metal substrate, and an organic/inorganic composite material substrate.

At least one inorganic layer may be disposed on a top surface of the base layer 110. The inorganic layer may include at least one of an aluminum oxide, a titanium oxide, a silicon oxide, a silicon nitride, a silicon oxynitride, a zirconium oxide and a hafnium oxide. The inorganic layer may be formed as multiple layers. Multiple inorganic layers may constitute a barrier layer and/or a buffer layer BFL on the base layer 110. According to the present embodiment, the display layer DPL is illustrated as including a buffer layer BFL.

The buffer layer BFL may improve bonding force between the base layer 110 and a semiconductor pattern. The buffer layer BFL may include at least one of silicon oxide, silicon nitride and silicon oxynitride. For example, the buffer layer BFL may include a structure in which a silicon oxide layer and a silicon nitride layer are alternately stacked.

The semiconductor pattern may be disposed on the buffer layer BFL. The semiconductor pattern may include polysilicon. However, the present disclosure is not limited thereto, and the semiconductor pattern may include amorphous silicon, low-temperature polycrystalline silicon, or oxide semiconductor.

Some semiconductor patterns of a semiconductor layer are merely illustrated in FIG. 3, and other semiconductor patterns may be further disposed in another region of the display panel 100. The semiconductor patterns may be arranged in a specific rule or pattern, while crossing the pixels PX. Different portions of the semiconductor pattern may have a different electrical properties from each other, depending on whether a respective portion is doped or to what amount the respective portion is doped. The semiconductor pattern may include a first region having higher conductivity and a second region having lower conductivity. The first region may be doped with N-type dopants or P-type dopants. A P-type transistor may include a doping region doped with the P-type dopant, and an N-type transistor may include a doping region doped with the N-type dopant. The second region may be a non-doping region or may be a region doped at a concentration lighter than the concentration of the first region.

The conductivity of the first region may be higher than the conductivity of the second region. The first region may actually serve as an electrode or a signal line through which an electrical signal is transmitted. The second region may actually correspond to an active region AL (or channel) of a transistor. In other words, a portion of the semiconductor pattern may be an active region of a transistor, another portion of the semiconductor pattern may be a source region or a drain region of the transistor, and still another portion of the semiconductor pattern may be a connection electrode or a connection signal line SCL.

Each of pixels PX may have an equivalent circuit including seven transistors, one capacitor, and a light emitting device, and the equivalent circuit of the pixel PX may be modified in various forms. FIG. 3 illustrates that the pixel PX includes one transistor 100PC and one light emitting device 100PE which is connected to the transistor 100PC, by way of example.

A source SC, an active region AL, and a drain DR of the transistor 100PC may be formed from the semiconductor pattern. The source SC and the drain DR may extend from the active region AL in directions opposite to each other, when viewed from the cross-sectional view. A portion of a connection signal line SCL formed from the semiconductor patterns is illustrated in FIG. 3. That is, the connection signal line SCL and the semiconductor pattern may be respective portions of the semiconductor layer. Although not separately illustrated, the connection signal line SCL may be connected with the drain DR of the transistor 100PC, when viewed from a plan view.

A first insulating layer 10 may be disposed on the buffer layer BFL. The first insulating layer 10 may be commonly provided in a plurality of pixels PX to cover the semiconductor pattern. The first insulating layer 10 may be an inorganic layer and/or an organic layer, and may have a single-layer structure or a multi-layer structure. The first insulating layer 10 may include at least one of an aluminum oxide, a titanium oxide, a silicon oxide, a silicon nitride, a silicon oxynitride, a zirconium oxide and a hafnium oxide. According to the present embodiment, the first insulating layer 10 may be a silicon oxide layer having a single-layer structure. The first insulating layer 10 and an insulating layer of the circuit layer 120, which is to be described later, may be an inorganic layer and/or an organic layer, and may have a single-layer structure or a multi-layer structure. The inorganic layer may include, but is not limited to, at least one of the above-described materials.

A gate GT of the transistor 100PC is disposed on the first insulating layer 10. The gate GT may be a portion (or a pattern) of a metal pattern layer. The gate GT overlaps (or corresponds to) the active region AL. The gate GT may function as a mask in a process of doping the semiconductor pattern.

A second insulating layer 20 may be disposed on the first insulating layer 10 and may cover the gate GT. The second insulating layer 20 may be commonly provided in the pixels PX. The second insulating layer 20 may be an inorganic layer and/or an organic layer, and may have a single-layer structure or a multi-layer structure. The second insulating layer 20 may include at least one of silicon oxide, silicon nitride and silicon oxynitride. According to the present embodiment, the second insulating layer 20 may have a multi-layer structure including a silicon oxide layer and a silicon nitride layer.

A third insulating layer 30 may be disposed on the second insulating layer 20. The third insulating layer 30 may have a single-layer or multi-layer structure. According to the present embodiment, the third insulating layer 30 may have a multi-layer structure including a silicon oxide layer and a silicon nitride layer.

A first connection electrode CNE1 may be disposed on the third insulating layer 30. The first connection electrode CNE1 may be connected to the connection signal line SCL through or at a first contact hole CNT-1 formed or provided extended through the first insulating layer 10, the second insulating layer 20, and the third insulating layer 30.

A fourth insulating layer 40 may be disposed on the third insulating layer 30. The fourth insulating layer 40 may be a single silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a second contact hole CNT-2 formed through the fourth insulating layer 40 and the fifth insulating layer 50.

A sixth insulating layer 60 may be disposed on the fifth insulating layer 50 to cover the second connection electrode CNE2. The sixth insulating layer 60 may be an organic layer.

The light emitting device layer 130 may be disposed on the circuit layer 120. The light emitting device layer 130 may include the light emitting device 100PE. For example, the light emitting device layer 130 may include an organic light emitting material, an inorganic light emitting material, an organic-inorganic light emitting material, a quantum dot, a quantum rod, a micro-LED, or a nano-LED. The following description will be described regarding the light emitting device 100PE which is an organic light emitting device, by way of example, but the present disclosure is not specifically limited thereto.

The light emitting device 100PE may include a first electrode AE, a light emitting layer EL, and a second electrode CE.

The first electrode AE may be disposed on the sixth insulating layer 60. The first electrode AE may be connected to the second connection electrode CNE2 through a third contact hole CNT-3 formed through the sixth insulating layer 60.

A pixel defining layer 70 may be disposed on the sixth insulating layer 60 and may cover a portion of the first electrode AE. An opening 70-OP is defined in the pixel defining layer 70. The opening 70-OP of the pixel defining layer 70 exposes at least a portion of the first electrode AE to outside of the pixel defining layer 70.

A display region DA of the display panel 100 (see FIG. 4) may include a light emitting region PXA and a non-light emitting region NPXA which is adjacent to the light emitting region PXA. The non-light emitting region NPXA may surround the light emitting region PXA in a plan view. According to the present embodiment, the light emitting region PXA is defined to correspond to the portion of the first electrode AE, which is exposed by the opening 70-OP.

The light emitting layer EL may be disposed on the first electrode AE. The light emitting layer EL may be disposed in a region defined by the opening 70-OP. In other words, the light emitting layer EL may be separately formed in each of pixels PX, to be spaced apart from each other along the circuit layer 120. When the light emitting layer EL is separately formed in each pixel PX, each of the light emitting layers EL may emit light of at least one of a blue color, a red color and a green color. However, the present disclosure is not limited thereto. For example, the light emitting layer EL may be commonly provided in the pixels PX. In this case, the light emitting layer EL may provide blue light or white light.

The second electrode CE may be disposed on the light emitting layer EL. The second electrode CE may be integrally disposed in the pixels PX in common.

Although not illustrated, a hole control layer may be disposed between the first electrode AE and the light emitting layer EL. The hole control layer may be commonly disposed in the light emitting region PXA and the non-light emitting region NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in the pixels PX such as by using an open mask.

The encapsulating layer 140 may be disposed on the light emitting device layer 130. The encapsulating layer 140 may include an inorganic layer, an organic layer, and an inorganic layer sequentially stacked in order from the light emitting device layer 130, and layers constituting the encapsulating layer 140 are not limited thereto.

The inorganic layers may protect the light emitting device layer 130 from moisture and oxygen, and the organic layer may protect the light emitting device layer 130 from a foreign material such as dust particles. The inorganic layers may include a silicon nitride layer, a silicon oxynitride layer, a silicon oxide layer, a titanium oxide layer, an aluminum oxide layer, or the like. The organic layer may include, but is not limited to, an acrylic-based organic layer.

The sensor layer ISL may include a base layer 150 (e.g., a second base layer), a first conductive layer 160, a sensing insulating layer 170, a second conductive layer 180, and a cover insulating layer 190.

The base layer 150 may be an inorganic layer including at least one of silicon nitride, silicon oxynitride and silicon oxide. Alternatively, the base layer 150 may be an organic layer including epoxy-based resin, acrylate-based resin, or imide-based resin. The base layer 150 may have a single-layer structure or may have a multi-layer structure stacked in (or along) the third direction DR3. According to an embodiment, the base layer 150 may be omitted.

Each of the first conductive layer 160 and the second conductive layer 180 may have a single-layer structure or a multi-layer structure stacked in the third direction DR3.

A respective conductive layer in the single-layer structure may include a metal layer or a transparent conductive layer. The metal layer may include molybdenum, silver, titanium, copper, aluminum, or the alloy thereof. The transparent conductive layer may include transparent conductive oxide, such as indium tin oxide (ITO), indium zinc oxide (IZO), zinc oxide (ZnO), or indium tin zinc oxide (ITZO). In addition, the transparent conductive layer may include conductive polymer such as PEDOT, metal nano-wire, or graphene.

A respective conductive layer in the multi-layer structure may include a plurality of metal layers. The metal layers may, for example, have a three-layer structure of titanium/aluminum/titanium. The respective conductive layer in the multi-layer structure may include at least one metal layer and at least one transparent conductive layer.

At least one of the sensing insulating layer 170 and the cover insulating layer 190 may include an inorganic film. The inorganic film may include at least one of an aluminum oxide, a titanium oxide, a silicon oxide, a silicon nitride, a silicon oxynitride, a zirconium oxide, and hafnium oxide.

At least one of the sensing insulating layer 170 and the cover insulating layer 190 may include an organic film. The organic film may include at least one of acrylate-based resin, methacrylate-based resin, polyisoprene-based resin, vinyl-based resin, epoxy-based resin, urethane-based resin, cellulose-based resin, siloxane-based resin, polyimide-based resin, polyamide-based resin and perylene-based resin.

Figure 4:
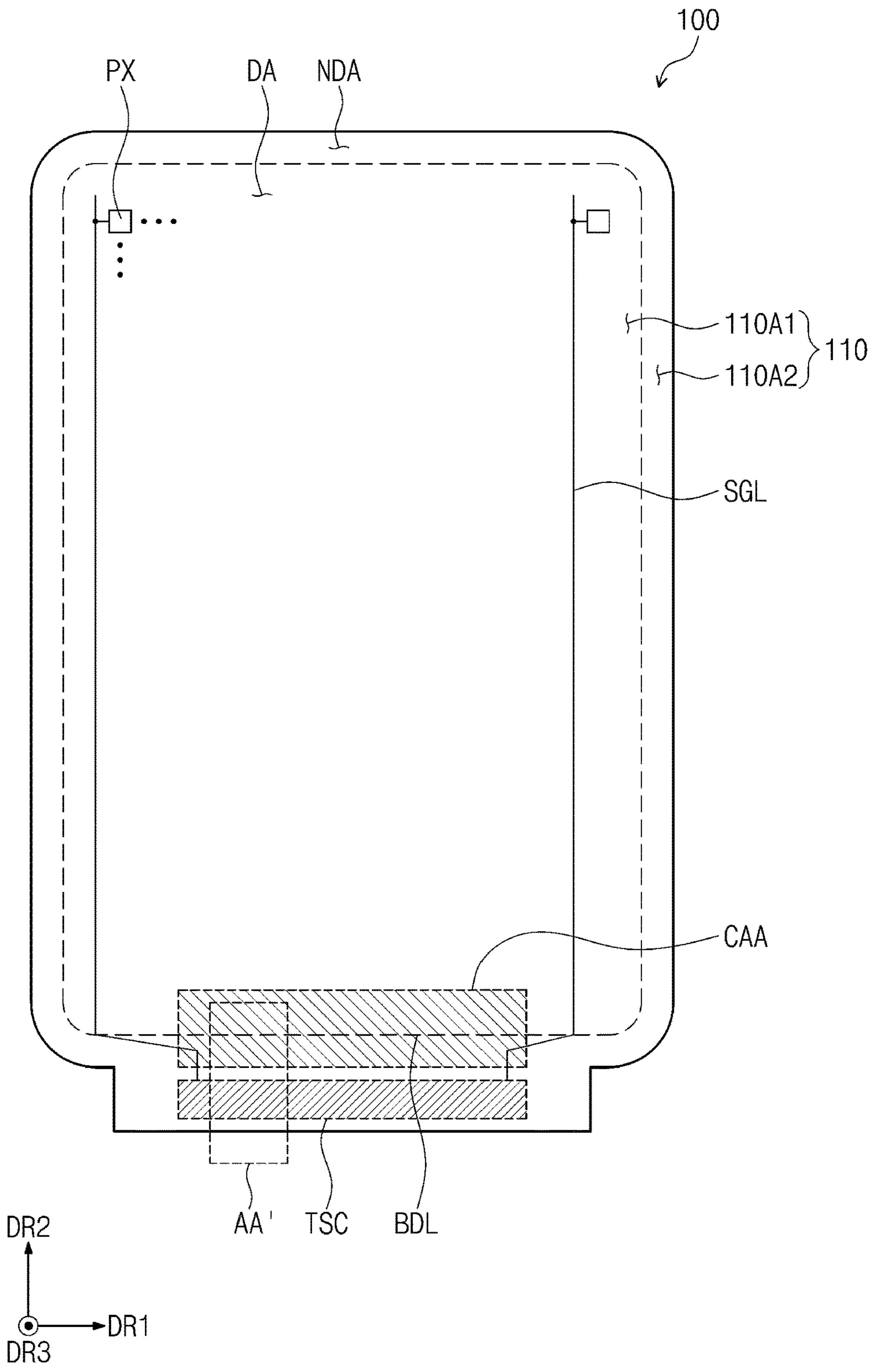
FIG. 4 is a plan view of a display panel, according to an embodiment of the present disclosure.

FIG. 4 is a plan view of the display panel 100 according to an embodiment of the present disclosure.

Referring to FIG. 4, the display panel 100 may include a display region DA and a non-display region NDA. A first region 110A1 of the base layer 110 may be overlapped with the display region DA, and a second region 110A2 of the base layer 110 may be overlapped with the non-display region NDA. In other words, the first region 110A1 of the base layer 110 may be a base surface for providing components disposed in the display region DA, and the second region 110A2 of the base layer 110 may be a base surface for providing components disposed in the non-display region NDA.

A plurality of pixels PX may be disposed in the display region DA. For example, the plurality of pixels PX may be disposed on the first region 110A1. A plurality of lines SGL may be disposed on the base layer 110 and may be electrically connected to the pixels PX. When viewed from a plan view, the plurality of lines SGL may extend from the first region 110A1 toward the second region 110A2, and may further extend onto the second region 110A2.

A test circuit TSC may be disposed on the second region 110A2 of the base layer 110. For example, the test circuit TSC may include at least one of a module crack detection (MCD) circuit, a bending crack detection (BCD) circuit, a spider crack detection (SCD) circuit, a design for test (DFT) circuit and an electro static discharge (ESD) circuit.

An attachable region CAA, to which a circuit film COF (see FIG. 7A) is attached, may be defined in the display panel 100. The circuit film COF (see FIG. 7A) may be disposed under the display panel 100 and may be attached to a plurality of pads PD (see FIG. 6) exposed to outside the display panel 100 at the rear surface of the display panel 100. Accordingly, the attachable region CAA may include not only a portion of the non-display region NDA but also a portion of the display region DA, in the plan view. The plurality of pads PD (see FIG. 6) may be disposed in the attachable region CAA.

The test circuit TSC may be away from (e.g., spaced apart from) a boundary BDL between the display region DA and the non-display region NDA and farther from the display region DA than the attachable region CAA. In other words, the test circuit TSC may be spaced apart from the plurality of pixels PX, while a plurality of pads PD (see FIG. 6) are disposed between the test circuit TSC and the plurality of pixels PX.

The display panel 100 illustrated in FIG. 4 may be a plan view of a state before being assembled to the display device 1000 (see FIG. 1). The display panel 100 in FIG. 4 may be flat or unbent, in a single plane. After testing of the display panel 100 using the test circuit TSC has been finished, a portion of the display panel 100 on which the test circuit TSC is disposed may be removed from a remainder of the display panel 100 or folded relative to another portion of the display panel 100 to be disposed below another portion of the display panel 100 along a thickness direction. Accordingly, an increase in the area (e.g., planar area) of the non-display region 1000NA (see FIG. 1) due to the test circuit TSC may be minimized or removed. Accordingly, an overall area of the non-display region 1000NA (see FIG. 1) of the display device 1000 (see FIG. 1) may be reduced.

Figure 5A:
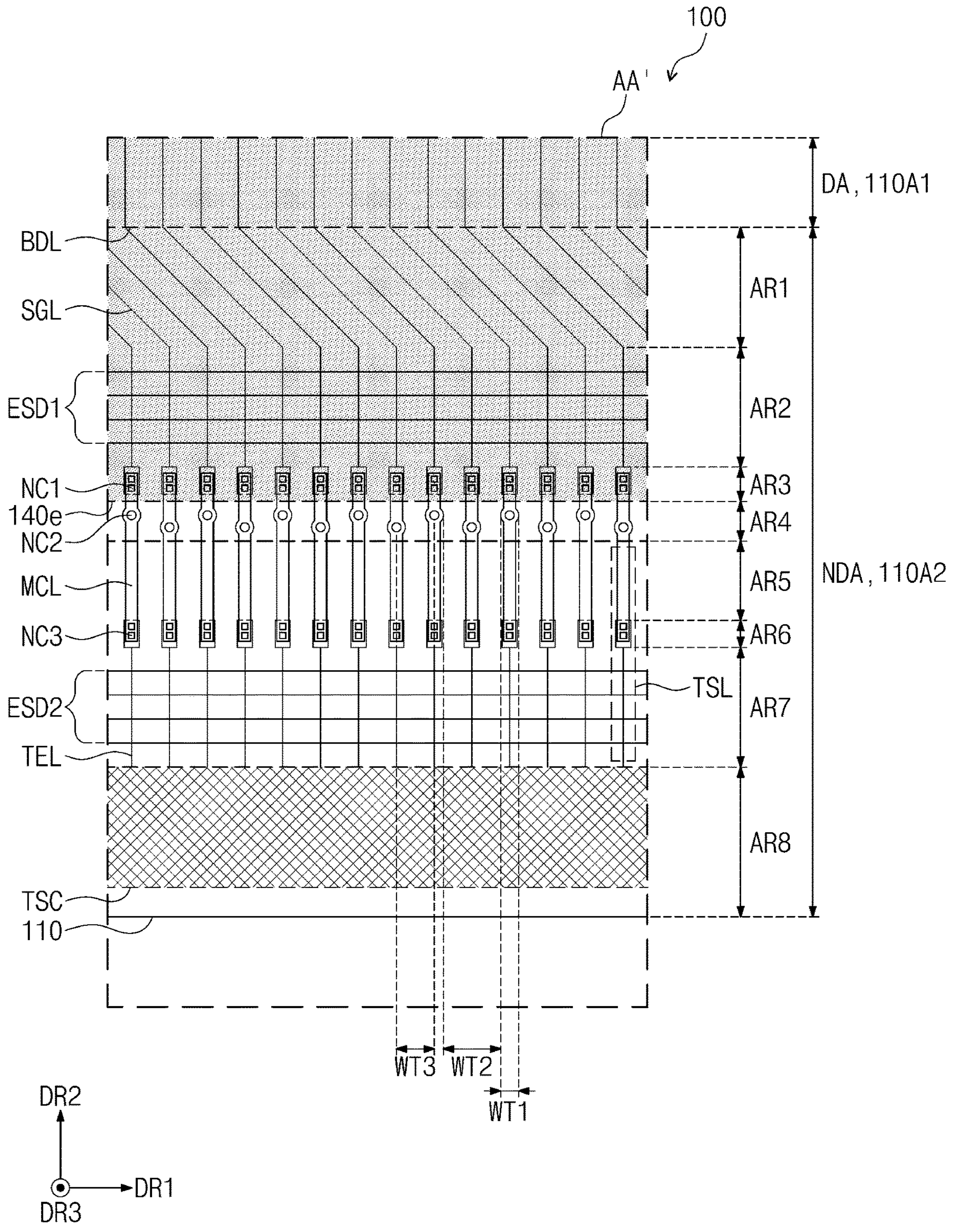
FIG. 5A is an enlarged plan view of region AA' illustrated in FIG. 4.

FIG. 5A is an enlarged plan view of region AA' illustrated in FIG. 4.

Referring to FIGS. 4 and 5A, the non-display region NDA may include first to eighth non-display regions AR1, AR2, AR3, AR4, AR5, AR6, AR7, and AR8 sequentially defined in a direction away from the boundary BDL of the display region DA, and toward an outer edge of the base layer 110.

The plurality of lines SGL may extend from the display region DA, in the form of a diagonal line, in the first non-display region AR1. The diagonal line may refer to a line extending inclined in a direction between the first direction DR1 and the second direction DR2. The first non-display region AR1 may be referred to as a fan-out region. Each of the plurality of lines SGL disposed in the first non-display region AR1 may be in a single-metal layer including molybdenum (Mo), and some of the plurality of lines SGL disposed in the first non-display region AR1 may be disposed in the same layer as the gate GT (see FIG. 3), but is not limited thereto. As being in the same layer, elements may be formed in a same process and/or as including a same material as each other, elements may be respective portions of a same material layer, may be on a same layer by forming an interface with a same underlying or overlying layer, etc., without being limited thereto.

A first electrostatic discharge protection circuit ESD1 may be disposed in the second non-display region AR2. The first electrostatic discharge protection circuit ESD1 may include an electrostatic discharge (ESD) diode. FIG. 5A illustrates that the first electrostatic discharge protection circuit ESD1 includes four lines spaced apart from each other along the second direction DR2, by way of example. Each of the four lines may have a form of extending in the attachable region CAA at one side of the display region DA, to surround the display region DA in a plan view, but is not specifically limited thereto. Each of the four lines may include a three-layer structure of titanium/aluminum/titanium, and may be disposed in the same layer as a layer of the first connection electrode CNE1 (see FIG. 3) or the second connection electrode CNE2 (see FIG. 3), but is not limited thereto.

A plurality of first connection lines MCL may be disposed in each of the third to sixth non-display regions AR3, AR4, AR5, and AR6. The plurality of first connection lines MCL may be spaced apart from each other along the base layer 110, in the first direction DR1. The plurality of first connection lines MCL may be connected to the plurality of lines SGL, respectively. For example, the plurality of first connection lines MCL and the plurality of lines SGL may be respectively connected to each other through a first contact part NC1 (e.g., a contact area, like a first contact area) in the third non-display region AR3. Each of the first connection lines MCL may include a three-layer structure of titanium/aluminum/titanium, and may be disposed in the same layer as a layer of the first connection electrode CNE1 (see FIG. 3) or the second connection electrode CNE2 (see FIG. 3), but is not limited thereto.

The first connection lines MCL may include second contact parts NC2 (e.g., a second contact area) disposed in the fourth non-display region AR4. The first connection lines MCL may be respectively electrically connected to the plurality of pads PD (see FIG. 6) through (or at) a second contact part NC2 in the fourth non-display region AR4. The second contact parts NC2 may be referred to as contact parts.

The second contact parts NC2 may be arranged in a zigzag manner in the first direction DR1, that is, staggered in position along the second direction DR2 to be non-aligned along the first direction DR1. A width of the first connection lines MCL at the second contact parts NC2 may have the width WT1 of about 20 micrometers in the first direction DR1. The size of each of the second contact parts NC2 may be larger than the size shown in FIG. 5A. The size of each of the second contact portions NC2 may be several times or more than the width of each of the first connection lines MCL. For example, a distance WT2 between two second contact parts NC2, which are aligned along the first direction DR1 and closest to each other along the first direction DR1, among the second contact parts NC2 may be about 18 micrometers. The pitch WT3 between the first connection lines MCL which are adjacent to each other may be about 19 micrometers. The maximum width of the fourth non-display region AR4 in the second direction DR2 may be about 100 micrometers or less. However, the above numeric values are provided only for the illustrative purpose, but the present disclosure is not limited thereto.

The first connection lines MCL may be disposed extending from the fourth non-display region AR4 and into the fifth non-display region AR5. After the test of the display panel 100 has been finished, when a portion of the display panel 100 having the test circuit TSC is removed or disposed in a different plane than the display region DA, the fifth non-display region AR5 may be separated from a reminder of the non-display region NDA, such as by cutting out the fifth non-display region AR5. Alternatively, the fifth non-display region AR5 may be a region bent and folded such that the portion of the display panel 100 having the test circuit TSC is disposed in a different plane from the display region DA and under another portion of the display panel 100. Alternatively, the fifth non-display region AR5 may be referred to as a cutting region or a folding region FIA (see FIG. 7B). The display panel 100 (or the display device 1000 (see FIG. 7B)) may be foldable at the folding region FIA.

The additional connection lines TEL (or the third connection lines) may be disposed in the sixth and seventh non-display regions AR6 and AR7. The additional connection lines TEL may be connected to the first connection lines MCL, respectively. For example, the plurality of first connection lines MCL and the additional connection lines TEL may be respectively connected to each other through a third contact part NC3 (e.g., a third contact area) in the sixth non-display region AR6. The additional connection lines TEL may be in a single-metal layer including molybdenum (Mo) and may be disposed on the same layer as the layer of the gate GT (see FIG. 3), but the present disclosure is not specifically limited thereto.

A second electrostatic discharge protection circuit ESD2 may be disposed in the seventh non-display region AR7. The second electrostatic discharge protection circuit ESD2 may include an electrostatic discharge (ESD) diode. FIG. 5A illustrates that the second electrostatic discharge protection circuit ESD2 includes four lines spaced apart from each other, by way of example. The four lines may be overlapped with the additional connection lines TEL. Each of the four lines may include a multi-layer structure formed as titanium, aluminum, and titanium are sequentially stacked, and may be disposed in the same layer as a layer of the first connection electrode CNE1 (see FIG. 3) or the second connection electrode CNE2 (see FIG. 3), but is not limited thereto. Here, the plurality of signal lines SGL is closer to the display region DA than both the first electrostatic discharge protection circuit ESD1 and the second electrostatic discharge protection circuit ESD2.

The test circuit TSC may be disposed in the eighth non-display region ARB. The test circuit TSC may be electrically connected to the plurality of lines SGL through the additional connection lines TEL and the first connection lines MCL. For example, the test circuit TSC may include at least one of a module crack detection (MCD) circuit, a bending crack detection (BCD) circuit, a spider crack detection (SCD) circuit, a design for test (DFT) circuit and an electro static discharge (ESD) circuit.

According to an embodiment of the present disclosure, lines (e.g., signal line or conductive lines) extending in a direction away from the display region DA and the first region 110A1, from the second contact parts NC2, may be referred to as a plurality of test extension lines TSL. In other words, each of the test extension lines TSL may include the additional connection line TEL, together with a portion of the first connection lines MCL disposed in the fifth and sixth non-display regions AR5 and AR6 and the third contact parts NC3. In an embodiment, a portion of each of the test extension lines TSL may be removable from a remainder of the display panel 100 which is applied in a final product or final electronic device. In an embodiment, each of the test extension lines TSL may be bendable and foldable, such as at the folding region FIA, to dispose a portion of the non-display region NDA facing the display region DA along the thickness direction, in a display panel 100 which is bent or folded.

Figure 5B:
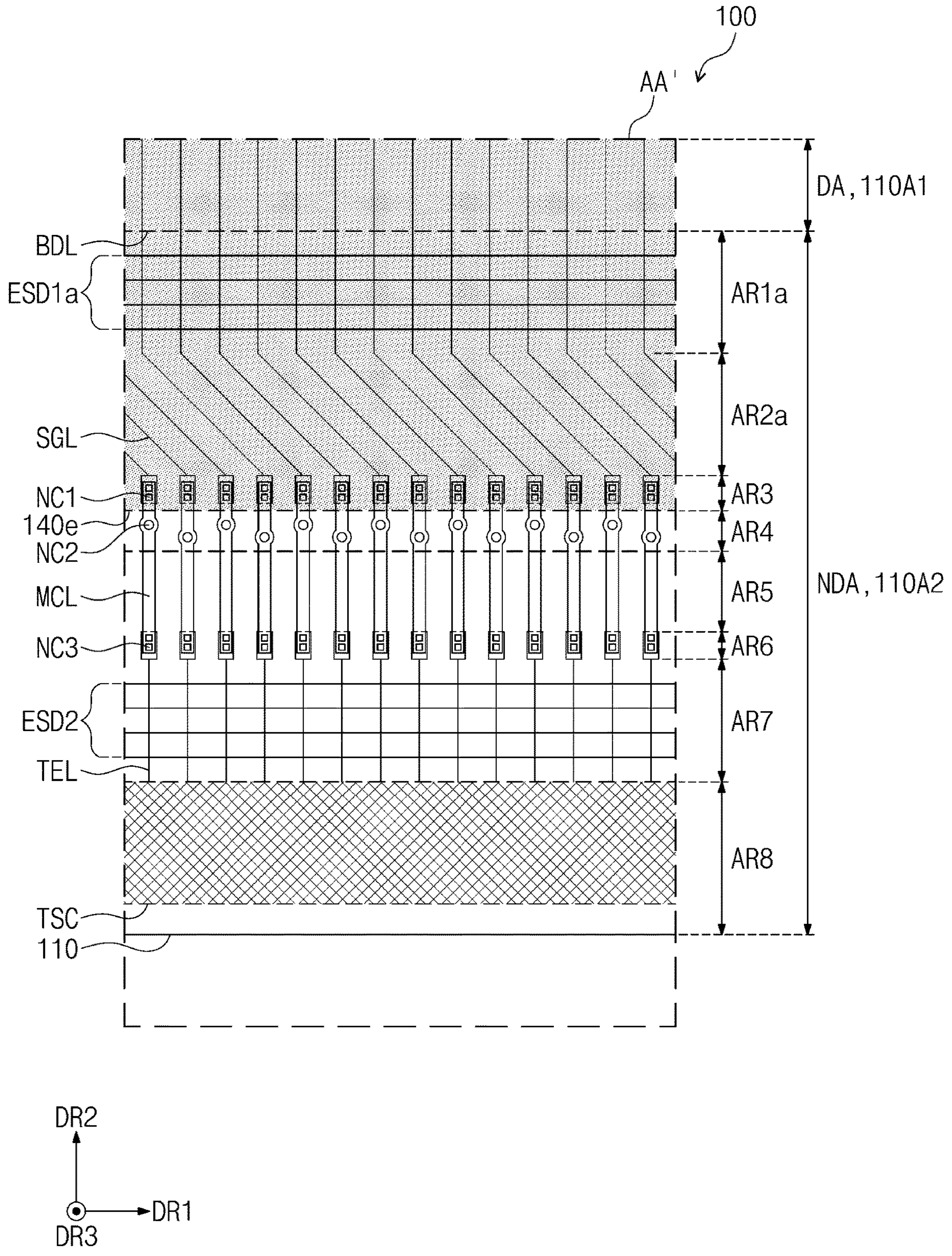
FIG. 5B is an enlarged plan view of region AA' illustrated in FIG. 4.

FIG. 5B is an enlarged plan view of region AA' illustrated in FIG. 4. In the following description made with reference to FIG. 5B, components the same as those of FIG. 5A will be assigned with the same reference numerals, and the duplication thereof will be omitted to avoid redundancy.

Referring to FIGS. 4 and 5B, the non-display region NDA may include first to eighth non-display regions AR1*a*, AR2*a*, AR3, AR4, AR5, AR6, AR7, and AR8 sequentially defined in a direction away from the boundary BDL of the display region DA.

A first electrostatic discharge protection circuit ESDla may be disposed in the first non-display region ARla as a respective non-display region which is closest to the display region DA among the plurality of non-display regions. The first electrostatic discharge protection circuit ESD1*a* may include an electrostatic discharge (ESD) diode. FIG. 5B illustrates that the first electrostatic discharge protection circuit ESD1*a* includes four lines spaced apart from each other, by way of example. Each of the four lines may have a form of surrounding the display region DA, but is not specifically limited thereto.

A plurality of lines SGL may extend in a diagonal line in the second non-display region AR2*a*. The diagonal line may refer to a line inclined extending in a direction between the first direction DR1 and the second direction DR2. The second non-display region AR2*a* may be referred to as a fan-out region.

Figure 5C:
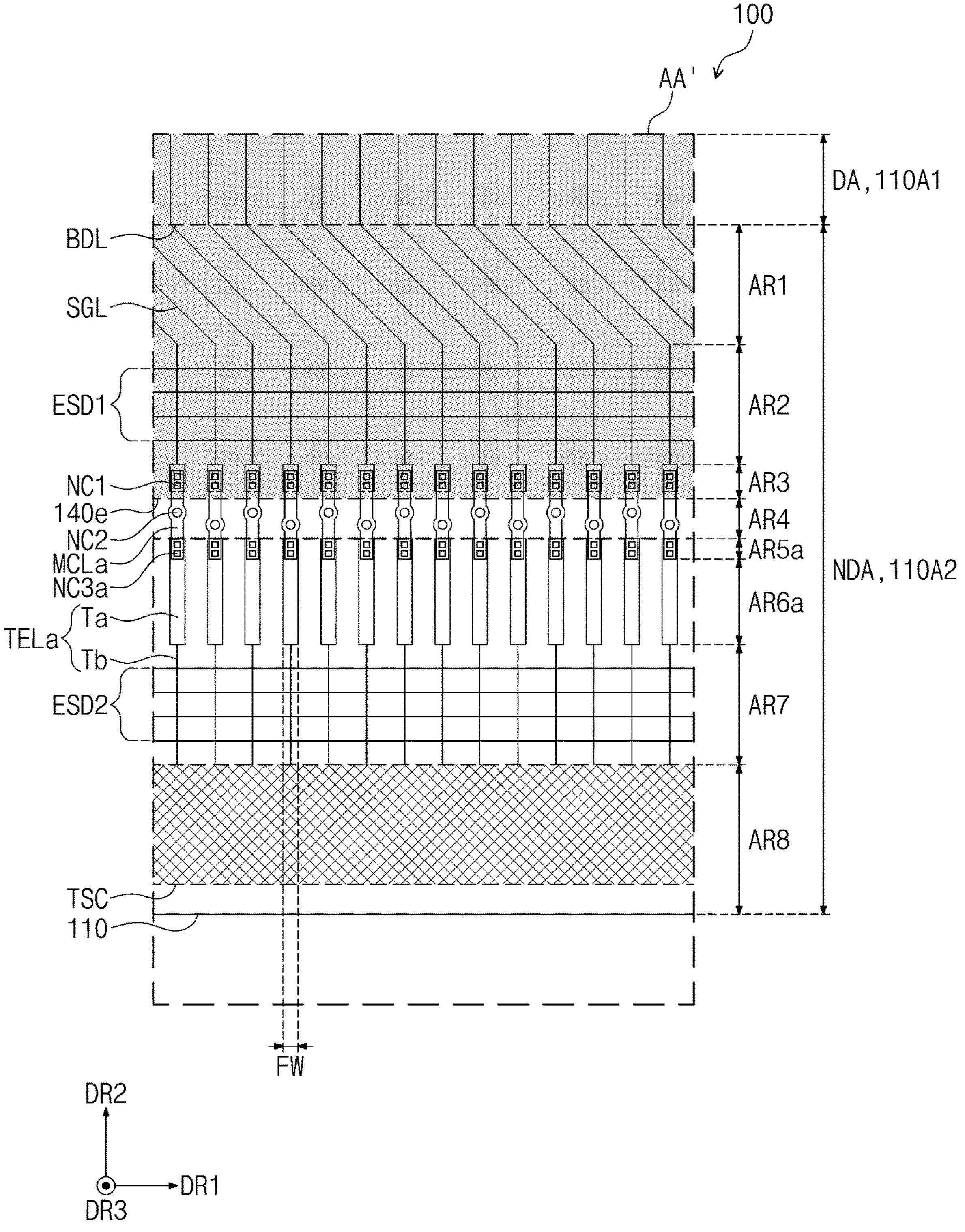
FIG. 5C is an enlarged plan view of region AA' illustrated in FIG. 4.

FIG. 5C is an enlarged plan view of region AA' illustrated in FIG. 4. In the following description made with reference to FIG. 5C, components the same as those of FIG. 5A will be assigned with the same reference numerals, and the duplication thereof will be omitted to avoid redundancy.

Referring to FIGS. 4 and 5C, the non-display region NDA may include first to eighth non-display regions AR1, AR2, AR3, AR4, AR5*a*, AR6*a*, AR7, and AR8 sequentially defined in a direction away from the boundary BDL of the display region DA.

A plurality of first connection lines MCLa may be disposed in the third to fifth non-display regions AR3, AR4, and AR5*a*. Additional connection lines TELa (or the third connection lines) may be disposed in the fifth, sixth and seventh non-display regions AR5*a*, AR6*a*, and AR7. The additional connection lines TELa may be connected to the first connection lines MCLa, respectively. For example, the plurality of first connection lines MCLa and the additional connection lines TELa may be respectively connected to each other through a third contact part NC3*a* in the fifth non-display region AR5*a*.

Each of the additional connection lines TELa may include a first part Ta disposed in the fifth and sixth non-display regions AR5*a* and AR6*a*, and a second part Tb disposed in the seventh non-display region AR7. The width FW of the first part Ta may be greater than the width of the second part Tb. For example, the width FW of the first part Ta may be about 2 micrometers. However, the present disclosure is not specifically limited thereto. The width FW of the first part Ta and the width of the second part Tb may be equal to each other.

After the test of the display panel 100 has been finished, when a portion of the display panel 100 having the test circuit TSC is removed, the sixth non-display region AR6*a* may be cut out. Alternatively, the sixth non-display region AR6*a* may be a region bent and folded such that the portion of the display panel 100 having the test circuit TSC is disposed under another portion of the display panel 100 (e.g., the display region DA). Alternatively, the sixth non-display region AR6*a* may be referred to as a cutting region or a folding region FIA (see FIG. 7B).

When the sixth non-display region AR6*a* is bent and folded, since the width FW of the first part Ta of each of the additional connection lines TELa is wider than that of the second part Tb, a probability of a crack occurring may be reduced. In addition, the additional connection lines TELa may be in a single-metal layer including molybdenum (Mo) and may be disposed on the same layer as the layer of the gate GT (see FIG. 3). Each of the additional connection lines TELa may include a three-layer structure of titanium/aluminum/titanium, and may be stronger for stress as compared to the first connection lines MCLa disposed in the same layer as the layer of the first connection electrode CNE1 (see FIG. 3) or the second connection electrode CNE2 (see FIG. 3).

Figure 6:
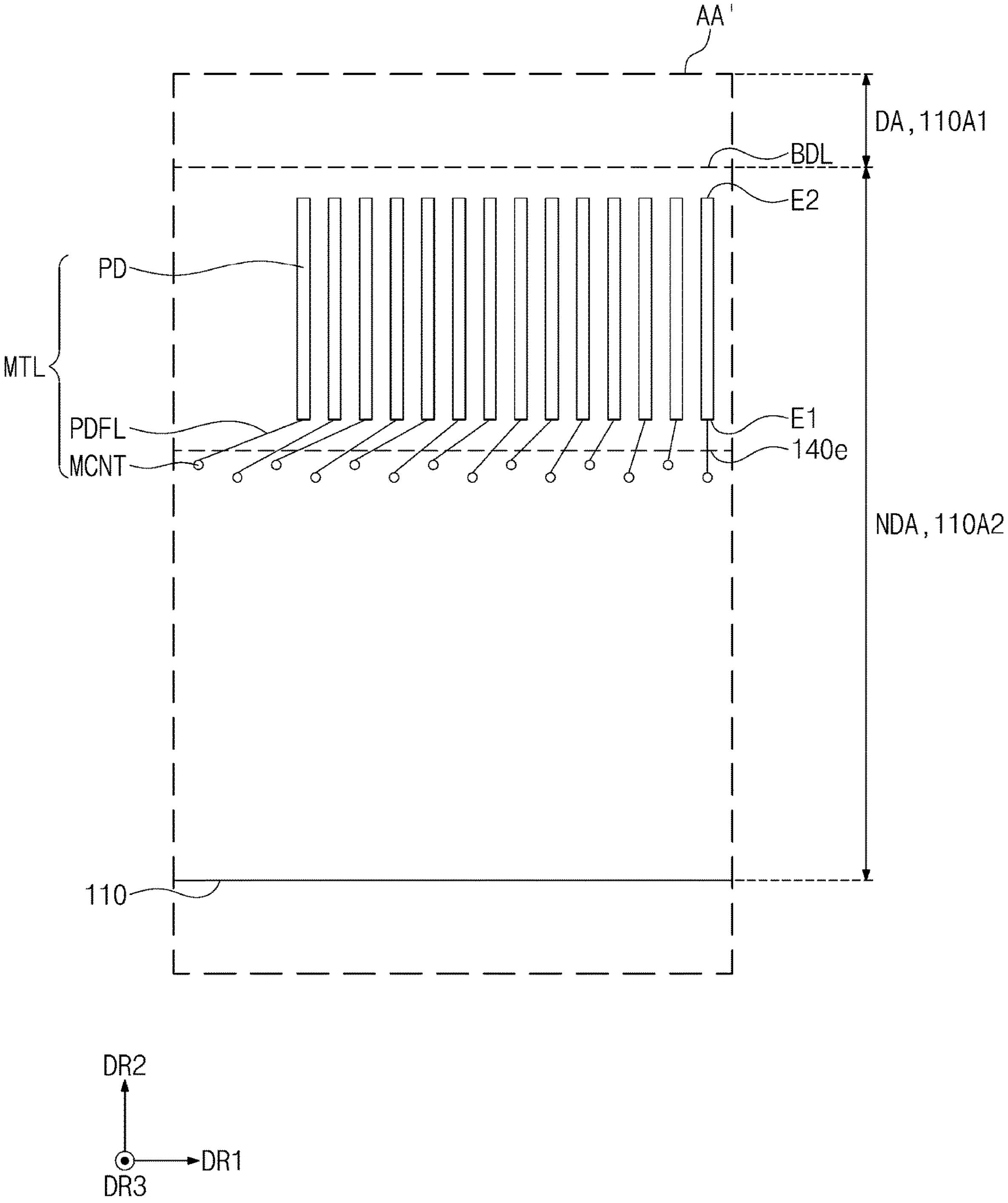
FIG. 6 is a plan view illustrating a conductive layer corresponding to region AA' illustrated in FIG. 4.

FIG. 6 is a plan view illustrating a conductive layer MTL corresponding to region AA' illustrated in FIG. 4.

Referring to FIGS. 4 and 6, the base layer 110 may include the conductive layer MTL. The conductive layer MTL may include or define the plurality of pads PD, a plurality of second connection lines PDFL, and a plurality of contact parts MCNT. The second connection lines PDFL may protrude from the pads PD, respectively.

The plurality of pads PDs may be arranged to be spaced apart from each other in the first direction DR1. Each of the plurality of pads PDs may include a first end E1 and a second end E2 spaced apart from each other in the second direction DR2, e.g., at opposing ends of the each pad PD. When viewed from a plan view, the first end E1 may be further from the first region 110A1 and the display region DA, than the second end E2. Each of the second connection lines PDFL may protrude from a respective pad PD at the first end E1 thereof. The contact parts MCNT for making contact with the first connection lines MCL (see FIG. 5A) may be connected to ends of the second connection lines PDFL, as distal ends of the second connection lines PDFL.

Each of the plurality of second connection lines PDFL may have a length as a major dimension along the plane, and a line width as a minor dimension along the plane which crosses the length. In a direction of the line width, each of the plurality of contact parts MCNT may be wider than the line width of each of the plurality of second connection lines PDFL. Accordingly, the contact parts MCNT may be stably connected to the second contact parts NC2 of the first connection lines MCL, respectively.

According to an embodiment of the present disclosure, the plurality of pads PD may be closer to the display region DA, than the contact parts MCNT. Accordingly, a cutting line or a folding line of the display panel 100 may be provided to be adjacent to the contact parts MCNT without considering an area of a region for the plurality of pads PD. Accordingly, the display device 1000 (see FIG. 1) having the non-display region 1000NA (see FIG. 1) further reduced in area may be provided.

Figure 7A:
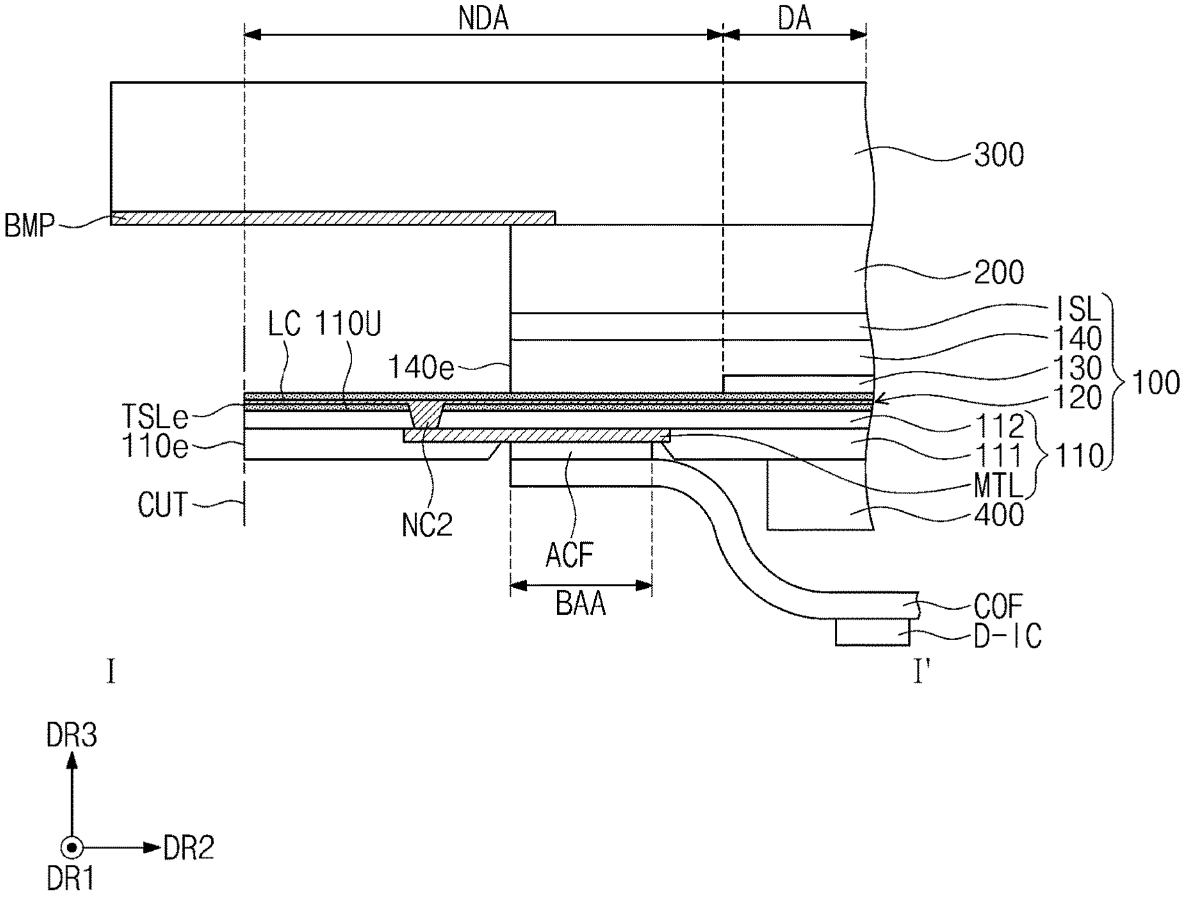
FIG. 7A is a cross-sectional view illustrating some components of a display device taken along line I-I' of FIG. 1, according to an embodiment of the present disclosure.

FIG. 7A is a cross-sectional view illustrating some components of the display device 1000 taken along line I-I' of FIG. 1, according to an embodiment of the present disclosure.

Referring to FIGS. 6 and 7A, the base layer 110 may have a multi-layer structure. For example, the base layer 110 may include a first sub-base layer 111, a second sub-base layer 112 disposed on the first sub-base layer 111, and a conductive layer MTL disposed between the first sub-base layer 111 and the second sub-base layer 112. The conductive layer MTL within the base layer 110 may include or define the plurality of pads PD, the plurality of second connection lines PDFL, and the plurality of contact parts MCNT, as described with reference to FIG. 6. In other words, the plurality of pads PD may be disposed under a top surface 110U of the base layer 110 which is closest to the light emitting device layer 130. That is the plurality of pads PD may be further from the light emitting device layer 130 than the top surface 110U of the base layer 110.

Each of the first sub-base layers 111 and the second sub-base layers 112 may include a polyimide-based resin. In addition, each of the first sub-base layers 111 and the second sub-base layers 112 may include at least one of acrylate-based resin, methacrylate-based resin, polyisoprene-based resin, a vinyl-based resin, epoxy-based resin, a urethane-based resin, cellulose-based resin, a siloxane-based resin, polyamide-based resin and perylene-based resin. In the present specification, the wording "~~-based resin" may refer to that "~~-based resin" includes a functional group of "~~."

The conductive layer MTL may have a single-layer structure or may have a multi-layer structure stacked in the third direction DR3. For example, the conductive layer MTL in a single-layer structure may include molybdenum (Mo), silver (Ag), titanium (Ti), copper (Cu), aluminum (Al), or an alloy thereof. The conductive layer MTL in the multi-layer structure may include metal layers. The metal layers may, for example, have a two-layer structure of aluminum/titanium, or a three-layer structure of titanium/aluminum/titanium.

Referring to FIGS. 5A and 7A, the circuit layer 120 may include a line group LC. The line group LC may include the plurality of lines SGL, the plurality of first connection lines MCL, and the plurality of additional connection lines TEL. A component penetrating the second sub-base layer 112 among the line groups LC may be the first connection lines MCL. The second sub-base layer 112 may define a first opening which exposes conductive layer MTL to outside the base layer 110. That is, the second contact part NC2 of the first connection lines MCL may be a protruding portion of the first connection lines MCL which penetrates the second sub-base layer 112 at the first opening, to be electrically connected to the conductive layer MTL within the base layer 110.

A second opening for exposing a portion of the conductive layer MTL to outside the base layer 110 may be defined in the first sub-base layer 111. That is, the conductive layer MTL may be exposed to outside the base layer 110 at both the top surface 110U and the bottom surface which is opposite to the top surface 110U. A conductive adhesive layer ACF may be attached to a portion of the exposed conductive layer MTL, at the second opening. The circuit film COF, on which a chip D-IC is mounted, may be electrically connected to the display panel 100 through the conductive adhesive layer ACF, at the second opening. Although FIG. 7A illustrates that the chip D-IC is mounted on the bottom surface of the circuit film COF, the chip D-IC may be mounted on the top surface of the circuit film COF. In addition, the conductive adhesive layer ACF may be an anisotropic conductive layer, but the present disclosure is not specifically limited thereto. For example, the conductive adhesive layer ACF may be omitted. In this case, the circuit film COF may make direct contact with the conductive layer MTL to be electrically connected to the display panel 100. As being in contact, elements may form an interface therebetween.

According to an embodiment of the present disclosure, the plurality of pads PD may be disposed in the second region 110A2. The plurality of pads PD may include a portion of the conductive layer MTL exposed by the second opening defined in the first sub-base layer 111. When viewed from a plan view, an edge 140*e* of the encapsulating layer 140 may be overlapped with the second connection lines PDFL, respectively. When viewed from a plan view, each of the plurality of pads PD may be overlapped with the encapsulating layer 140, and the plurality of contact parts MCNT may be spaced apart from the encapsulating layer 140 along the base layer 110. In other words, an attachment region BAA of the conductive layer MTL to which the conductive adhesive layer ACF is attached, may be overlapped with the non-display region NDA and the encapsulating layer 140. The attachment region BAA may correspond to a contact area of the pad PD, at which the pad PD is connected to the circuit film COF, such as by the conductive adhesive layer ACF, without being limited thereto.

The window 300 may further include a bezel pattern BMP. The bezel pattern BMP may be a colored light blocking layer, and may be coated on the window 300. The bezel pattern BMP may be overlapped with the non-display region NDA (see FIG. 4).

The cross-section view illustrated in FIG. 7A illustrates a state in which a portion of the display panel 100 having the test circuit TSC is removed from remainder of the display panel 100, after testing of the display panel 100 has been finished. Portions of various layers of the display panel 100 (e.g., end portions) of the base layer 110 and the circuit layer 120 which are furthest from the display region DA) may be removable along a cutting line CUT. The cutting liner CUT may correspond to an end surface of a final-product display panel including the display panel 100 which is cut. For example, portions of the base layer 110 and the circuit layer 120 may be cut by a laser. In this case, the end 110*e* (e.g., end surface) of the base layer 110 may be aligned with an end TSLe of the line group LC. The end TSLe of the line group LC may correspond to ends TSLe of the plurality of test extension lines TSL (see FIG. 5A), which extend from the second contact part NC2 in a direction away from the display region DA and the first region 110A1. That is, the cutting line CUT as corresponding to the ends TSLe of the plurality of test extension lines TSL, may correspond to the seventh non-display region AR7 in FIGS. 5A to 5C, without being limited thereto. The cutting line CUT may further correspond to a location along the additional connection lines TEL which is between the second electrostatic discharge protection circuit ESD2 and the test circuit TSC, without being limited thereto.

According to an embodiment of the present disclosure, since the test circuit TSC is removed, the increase in area of the non-display region 1000NA (see FIG. 1), which is caused by presence of the test circuit TSC, may be reduced or removed. Accordingly, the display device 1000 (see FIG. 1) having the non-display region 1000NA (see FIG. 1) further reduced in area may be provided.

Figure 7B:
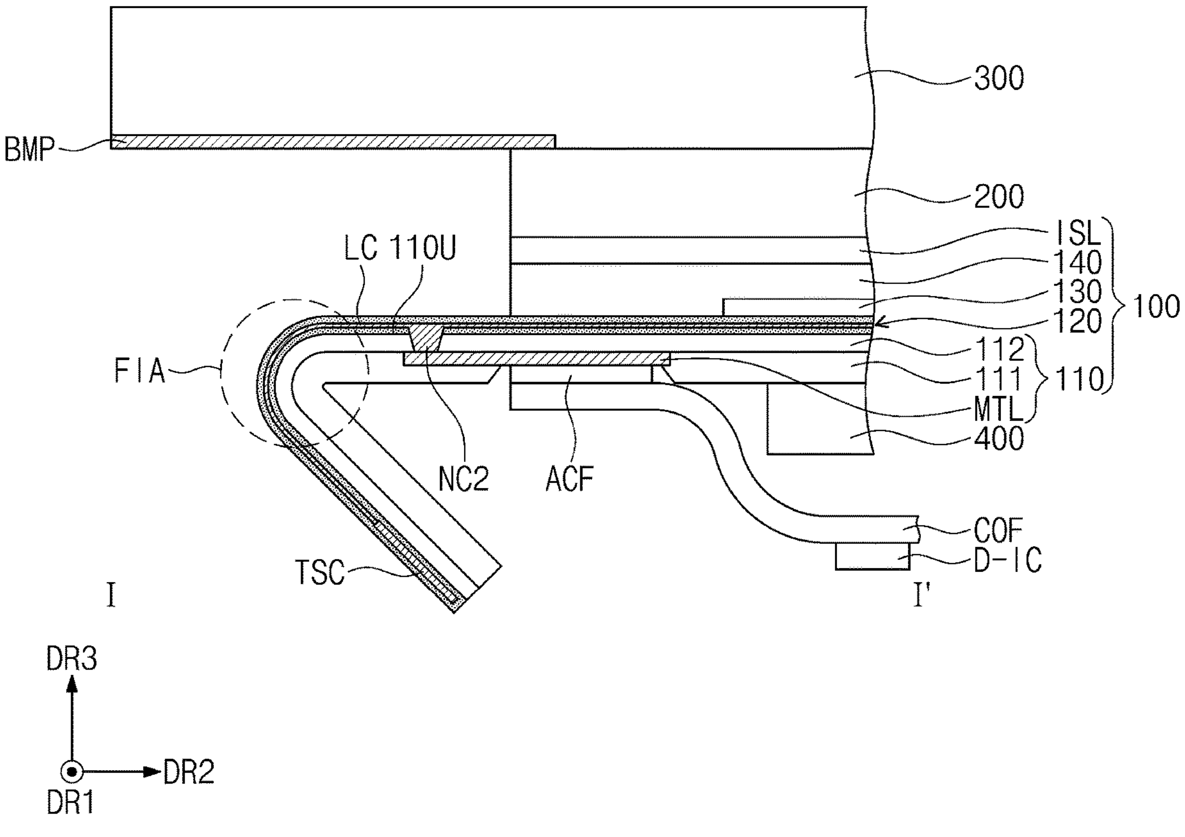
FIG. 7B is a cross-sectional view illustrating some components of a display device taken along line I-I' of FIG. 1, according to an embodiment of the present disclosure.

FIG. 7B is a cross-sectional view illustrating some components of the display device 1000 taken along line I-I' of FIG. 1, according to an embodiment of the present disclosure. In the following description made with reference to FIG. 7B, components the same as those of FIG. 7A will be assigned with the same reference numerals, and the duplication thereof will be omitted to avoid redundancy.

The cross-sectional view illustrated in FIG. 7B illustrates a state in which a portion of the display panel 100 having the test circuit TSC is bent and folded to be disposed under another portion of the display panel 100, after the test of the display panel 100 has been finished. That is, the display panel 100 which is tested, is bent at a folding region FIA. A folding region FIA illustrated in FIG. 7B may be the fifth non-display region AR5 illustrated in each of FIGS. 5A and 5B, or the sixth non-display region AR6*a* illustrated in FIG. 5C.

The lines disposed in the folding region FIA are not used for the operation of the display panel 100. Accordingly, the folding region FIA may be folded at a maximum curvature. In other words, the folding region FIA may be fully folded. As the folding region FIA is completely folded, the lines disposed in the folding region FIA may be cracked or damaged.

According to an embodiment of the present disclosure, the display panel 100 which has the test circuit TSC, is tested and is bent and folded at the folding region FIA, disposes the portion of the display panel 100 which has the test circuit TSC under another portion of the display panel 100, to reduce the planar area of the non-display region 1000NA (see FIG. 1) caused by the test circuit TSC. Accordingly, the display device 1000 (see FIG. 1) having the non-display region 1000NA (see FIG. 1) reduced in area may be provided.

Figure 7C:
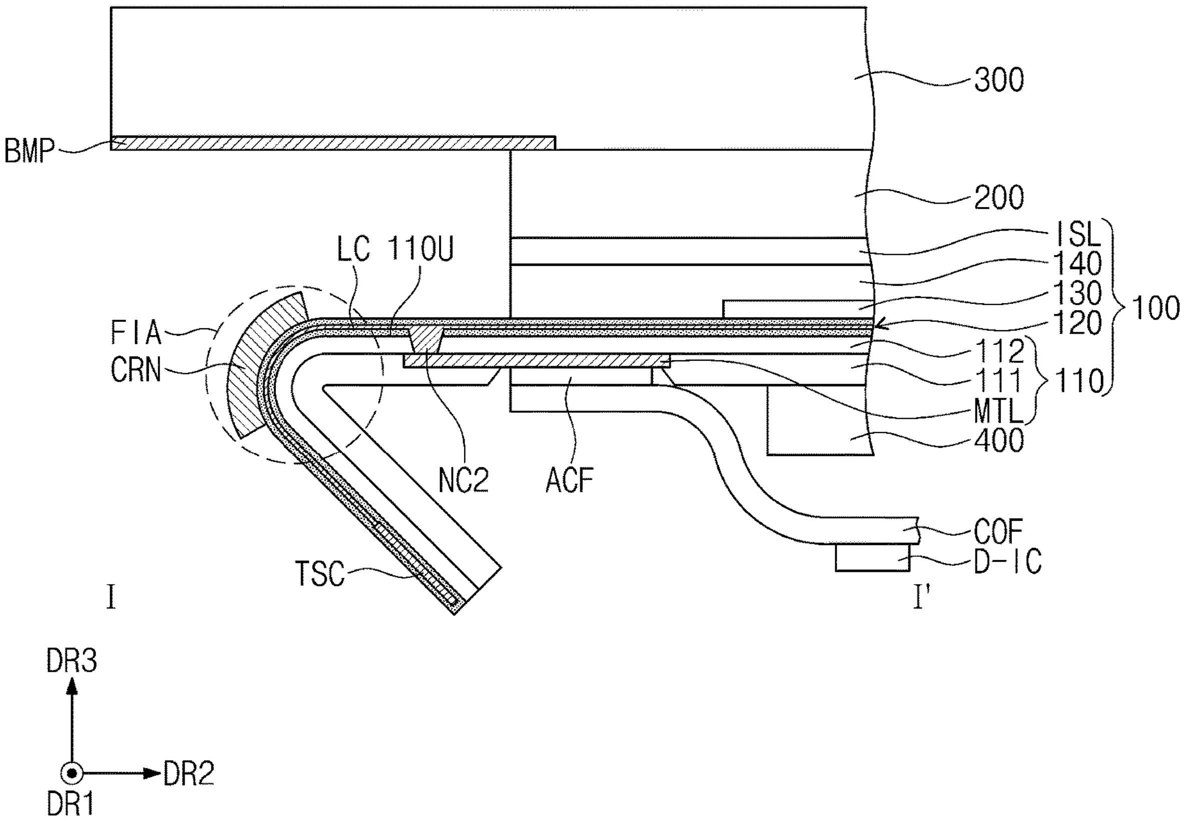
FIG. 7C is a cross-sectional view illustrating some components of a display device taken along line I-I' of FIG. 1, according to an embodiment of the present disclosure.

FIG. 7C is a cross-sectional view illustrating some components of the display device 1000 taken along line I-I' of FIG. 1, according to an embodiment of the present disclosure. In the following description made with reference to FIG. 7C, components the same as those of FIG. 7B will be assigned with the same reference numerals, and the duplication thereof will be omitted to avoid redundancy.

Referring to FIG. 7C, a reinforcing layer CRN may be provided in the folding region FIA. Since lines disposed in the folding region FIA are not used for the operation of the display panel 100, the folding region FIA may be fully folded, such as dispose an end portion of the display panel 100 parallel to the display region DA. However, in this process, the insulating layer or the line within the non-display region NDA at the end portion, may be cracked and exposed. According to the present embodiment, when the reinforcing layer CRN is provided by applying a resin to the folding region FIA, the insulating layer or the line is covered by the reinforcing layer CRN even if the insulating layer or the line is cracked, thereby blocking moisture from being infiltrated.

Figure 8:
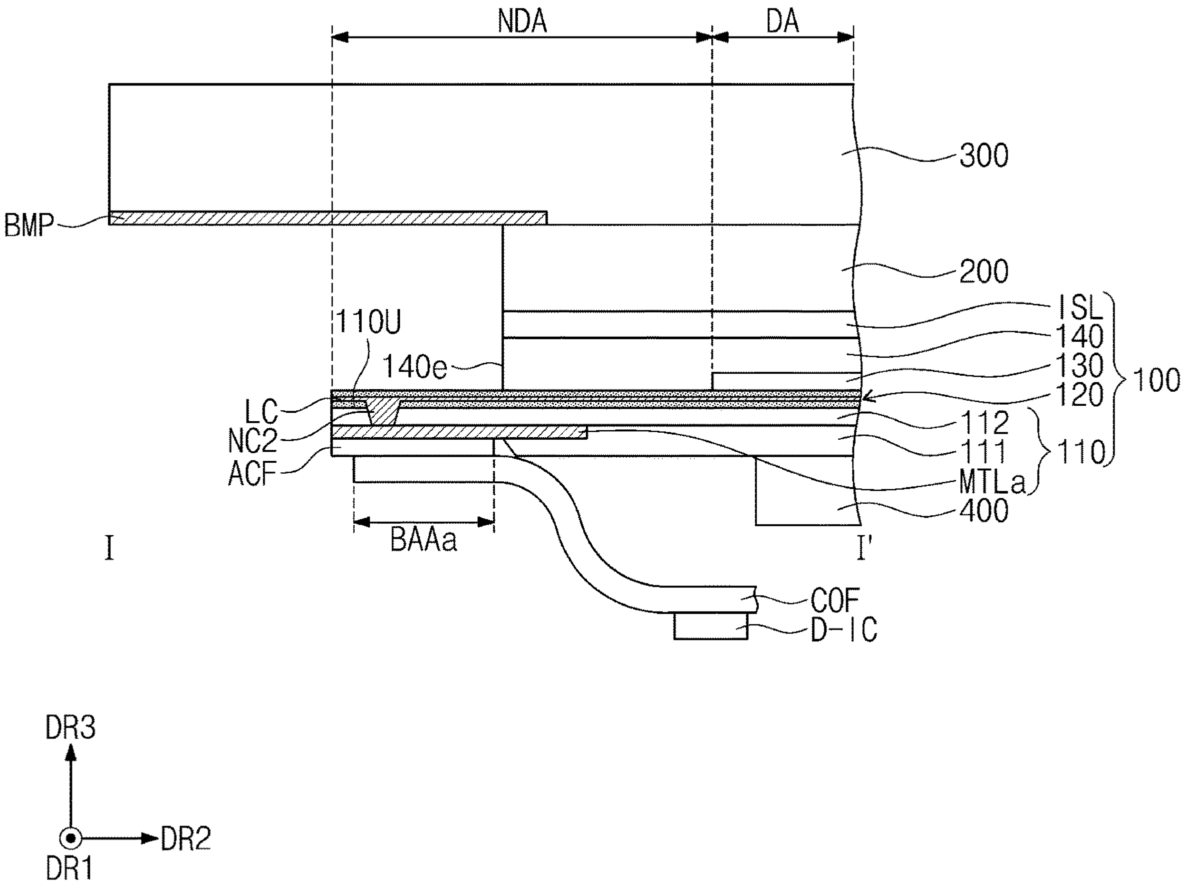
FIG. 8 is a cross-sectional view illustrating some components of the display device taken along line I-I' of FIG. 1, according to an embodiment of the present disclosure.

FIG. 8 is a cross-sectional view illustrating some components of the display device 1000 taken along line I-I' of FIG. 1, according to an embodiment of the present disclosure. In the following description made with reference to FIG. 8, components the same as those of FIG. 7A will be assigned with the same reference numerals, and the duplication thereof will be omitted to avoid redundancy.

Referring to FIG. 8, the base layer 110 may include the first sub-base layer 111, the second sub-base layer 112 disposed on the first sub-base layer 111, and a conductive layer MTLa disposed between the first sub-base layer 111 and the second sub-base layer 112. The conductive layer MTLa is exposed at both a lower surface thereof and at an end surface thereof which is furthest from the display region DA.

The conductive layer MTLa may be electrically connected to a line group LC of the circuit layer 120. The conductive adhesive layer ACF may be attached to a portion of the exposed conductive layer MTLa. In other words, an attachment region BAAa to which the conductive adhesive layer ACF is attached may be overlapped with the non-display region NDA and may not be overlapped with the encapsulating layer 140. As being not overlapped, elements may be spaced apart from each other or adjacent to each other, such as in a plan view. According to an embodiment of the present disclosure, the second contact part NC2 may be overlapped with the attachment region BAAa. Accordingly, the display device 1000 (see FIG. 1) having the non-display region 1000NA (see FIG. 1) further reduced in area may be provided.

Figure 9:
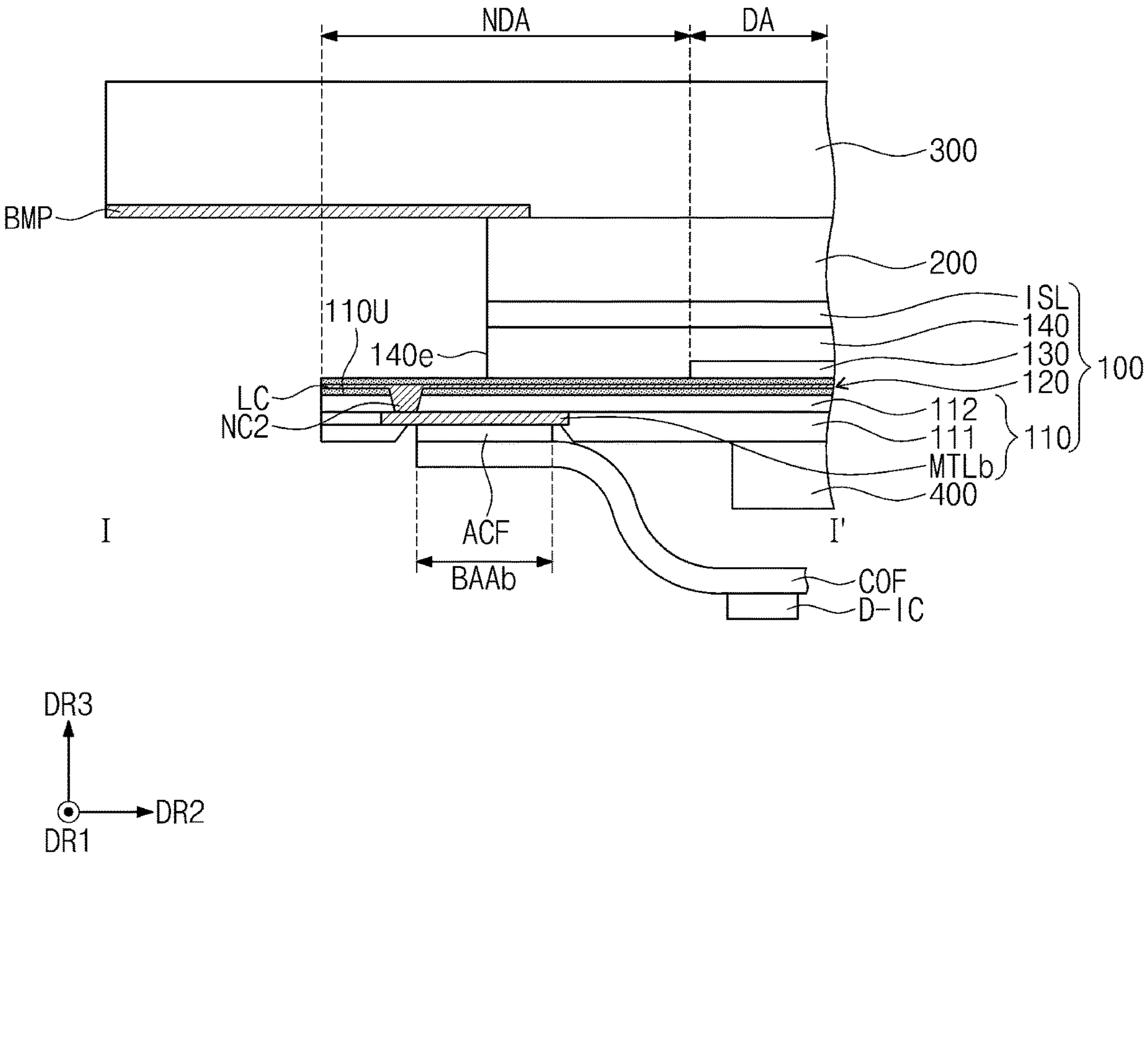
FIG. 9 is a cross-sectional view illustrating some components of the display device taken along line I-I' of FIG. 1, according to an embodiment of the present disclosure.

FIG. 9 is a cross-sectional view illustrating some components of the display device 1000 taken along line I-I' of FIG. 1, according to an embodiment of the present disclosure. In the following description made with reference to FIG. 9, components the same as those of FIG. 7A will be assigned with the same reference numerals, and the duplication thereof will be omitted to avoid redundancy.

Referring to FIG. 9, the base layer 110 may include the first sub-base layer 111, the second sub-base layer 112 disposed on the first sub-base layer 111, and a conductive layer MTLb disposed between the first sub-base layer 111 and the second sub-base layer 112.

The conductive layer MTLb may be electrically connected to a line group LC of the circuit layer 120. The conductive adhesive layer ACF may be attached to a portion of the conductive layer MTLb. In other words, an attachment region BAAb to which the conductive adhesive layer ACF is attached may be overlapped with the non-display region NDA and an edge 140*e* of the encapsulating layer 140. For example, a portion of the attachment region BAAb may be overlapped with the encapsulating layer 140, and another portion of the attachment region BAAb may not be overlapped with the encapsulating layer 140. That is, the conductive adhesive layer ACF extends further than the encapsulating layer 140, to define an extended portion of the conductive adhesive layer ACF.

Figure 10:
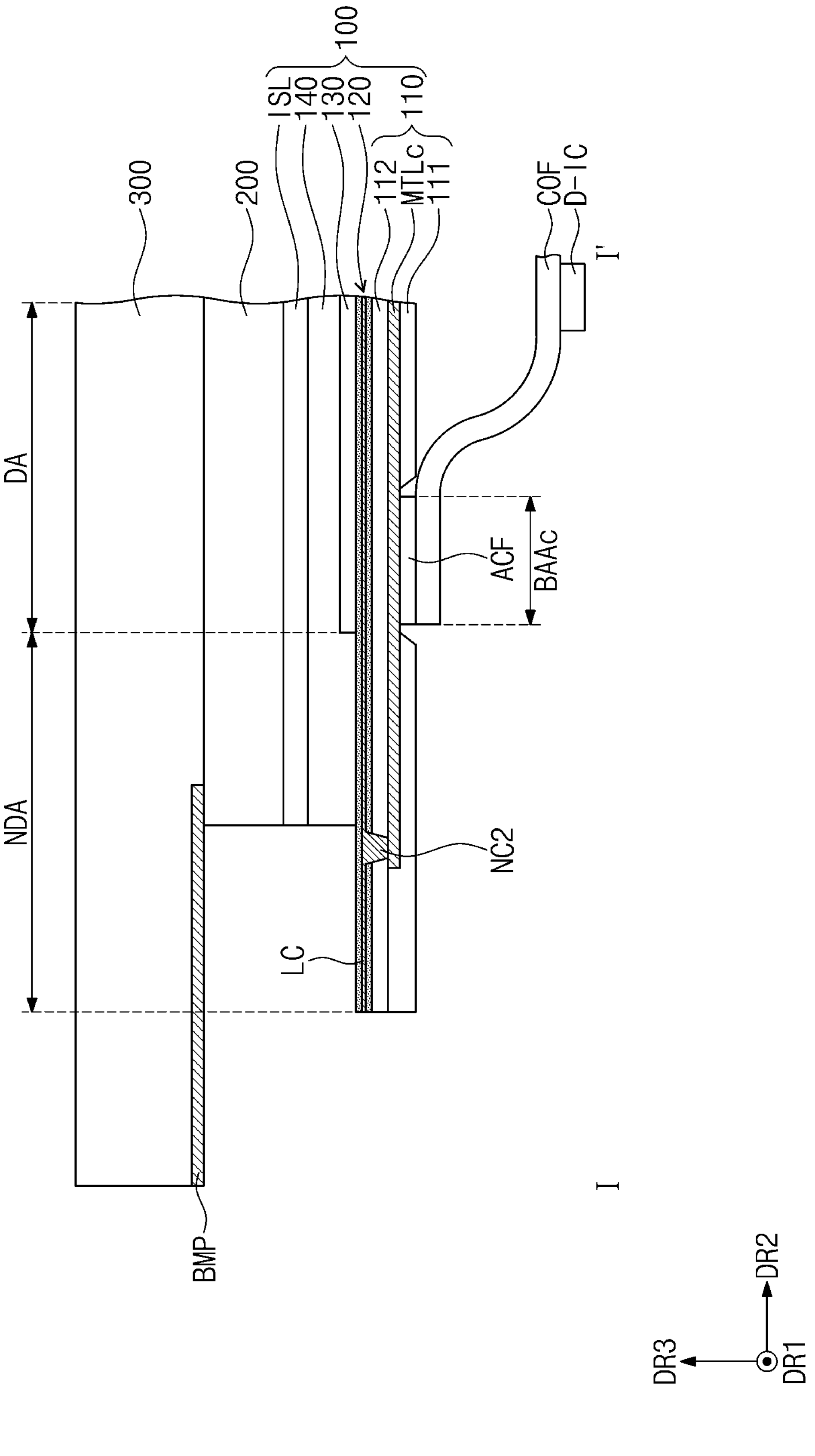
FIG. 10 is a cross-sectional view illustrating some components of a display device taken along line I-I' of FIG. 1, according to an embodiment of the present disclosure.

FIG. 10 is a cross-sectional view illustrating some components of the display device 1000 taken along line I-I' of FIG. 1, according to an embodiment of the present disclosure. In the following description made with reference to FIG. 10, components the same as those of FIG. 7A will be assigned with the same reference numerals, and the duplication thereof will be omitted to avoid redundancy.

Referring to FIG. 10, the base layer 110 may include the first sub-base layer 111, the second sub-base layer 112 disposed on the first sub-base layer 111, and a conductive layer MTLc disposed between the first sub-base layer 111 and the second sub-base layer 112.

The conductive layer MTLc may be electrically connected to a line group LC of the circuit layer 120. The conductive adhesive layer ACF may be attached to a portion of the exposed conductive layer MTLc. In other words, an attachment region BAAc to which the conductive adhesive layer ACF is attached may be overlapped with the display region DA. In other words, a plurality of pads PD included in the conductive layer MTLc may be disposed in the first region 110A1 (see FIG. 4). When viewed from a plan view, the plurality of pads PD may be overlapped with some of the plurality of pixels PX.

Referring to FIGS. 7A, 8, 9, and 10, the circuit film COF is attached to a lower portion of the top surface 110U of the base layer 110. Accordingly, positions of the attachment regions BAA, BAAa, BAAb, and BAAc may be variously adjusted regardless of a position relationship between the display region DA and the non-display region NDA. For example, each of the attachment regions BAA, BAAa, BAAb, and BAAc may be variously modified within the attachable region CAA illustrated in FIG. 4.

Although the descriptions made with reference to FIGS. 8, 9, and 10 have been made while focusing on an embodiment in which the test circuit TSC (see FIG. 5A) is cut out and removed as illustrated in FIG. 7A, embodiments as in FIGS. 8, 9, and 10 may be applicable to embodiments in which the region having the test circuit TSC is bent to be disposed under the display panel 100 as illustrated in FIG. 7B or FIG. 7C.

Figure 11:
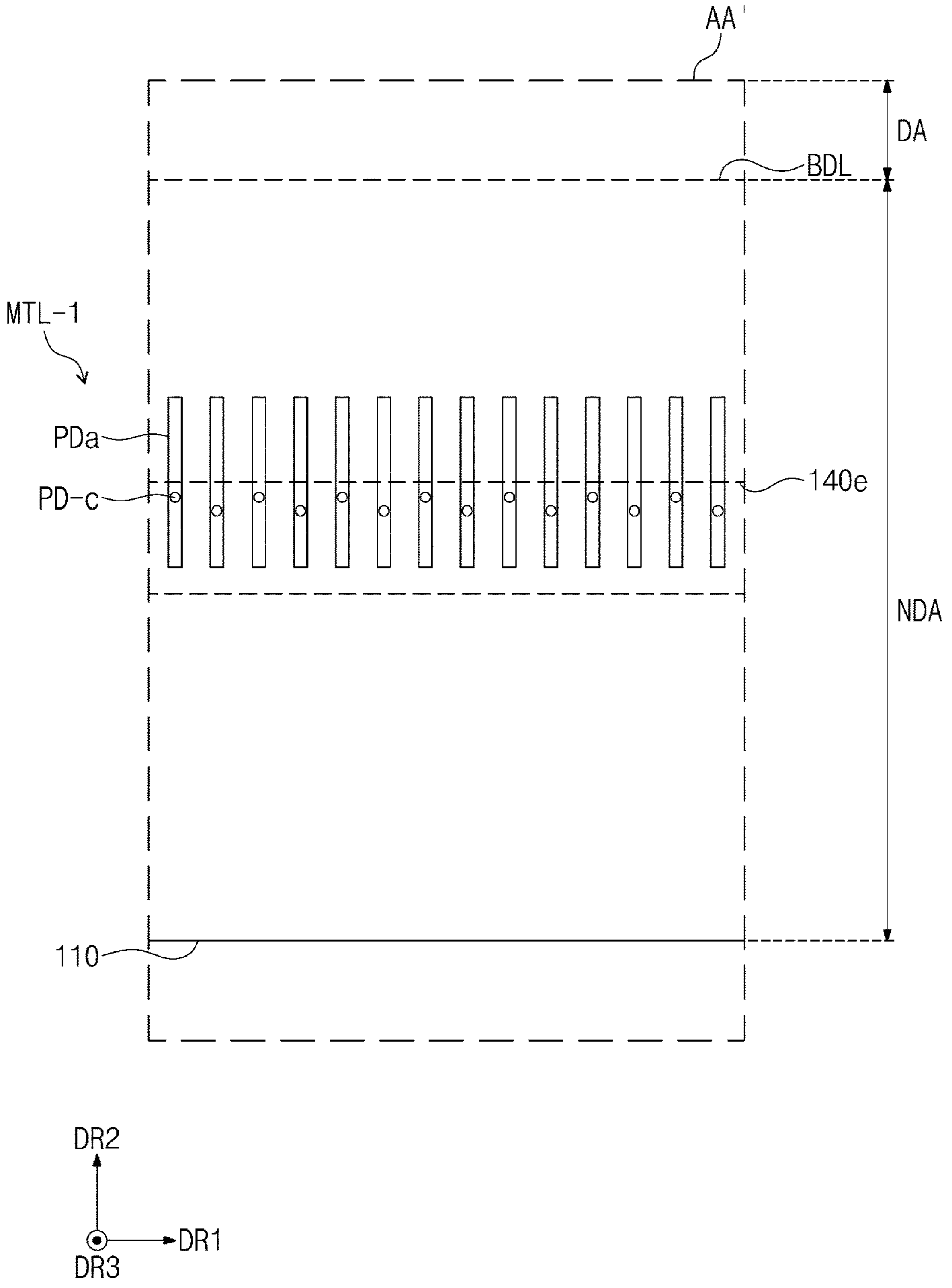
FIG. 11 is a plan view illustrating a conductive layer corresponding to region AA' illustrated in FIG. 4.

FIG. 11 is a plan view illustrating a conductive layer MTL-1 corresponding to region AA' illustrated in FIG. 4.

Referring to FIGS. 5A and 11, a conductive layer MTL-1 may include a plurality of pads PDa. The first connection lines MCL may make direct contact with the plurality of pads PDa. For example, contact parts PD-c of the conductive layer MTL-1 illustrated in FIG. 11 may make contact with the second contact parts NC2 of the first connection lines MCL. In other words, the second contact parts NC2 may be overlapped with the plurality of pads PDa, respectively, instead of being spaced apart from the pads PD like in FIG. 6.

Figure 12:
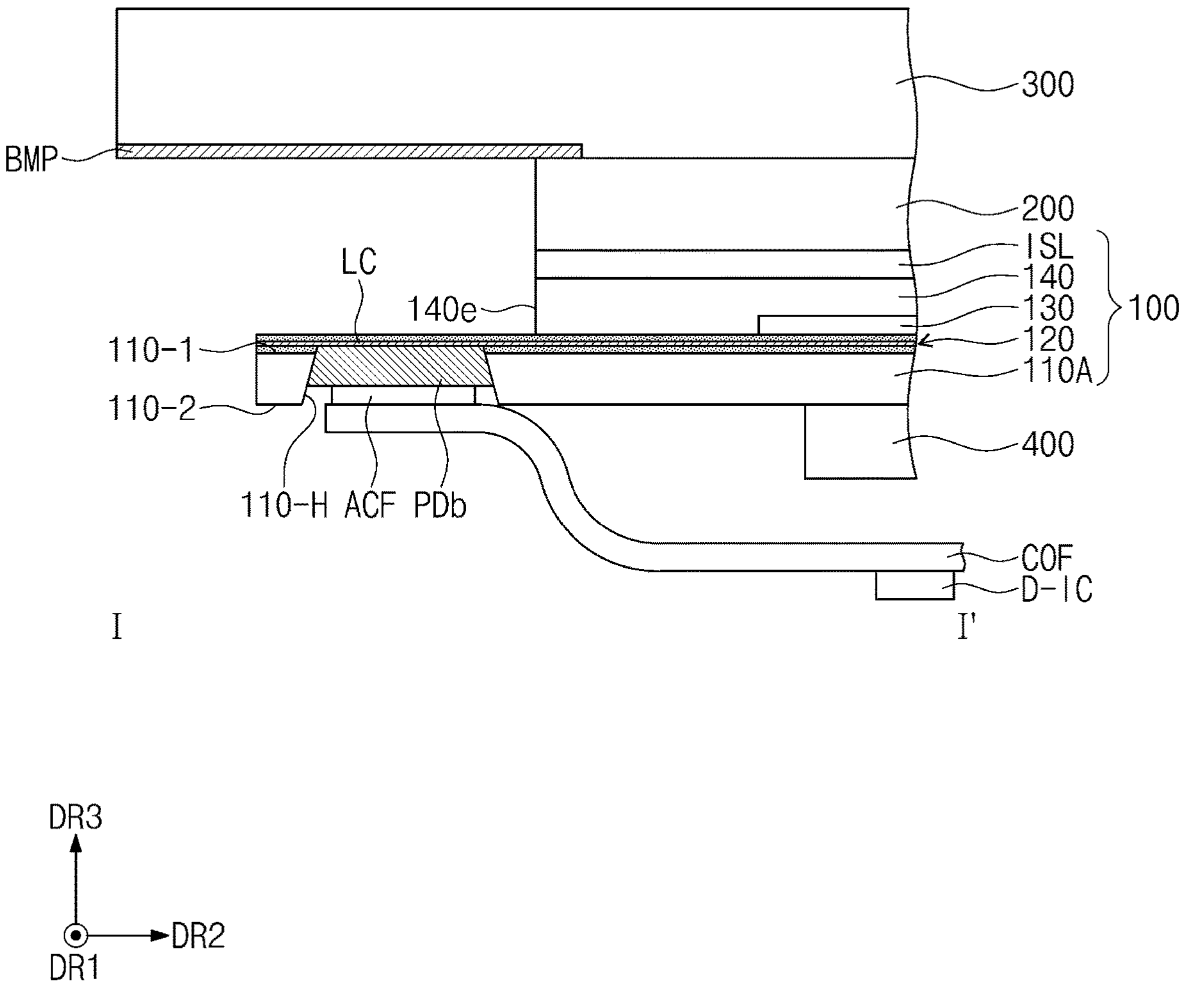
FIG. 12 is a cross-sectional view illustrating some components of a display device taken along line I-I' of FIG. 1, according to an embodiment of the present disclosure.

FIG. 12 is a cross-sectional view of some components of the display device 1000 taken along line I-I' of FIG. 1, according to an embodiment of the present disclosure.

Referring to FIG. 12, a base layer 110A may not include a respective conductive layer. The base layer 110A may have a single-layer structure or a multi-layer structure. In addition, the base layer 110A may have a flexible property or a rigid property.

The base layer 110A may include a first surface 110-1 and a second surface 110-2 which faces the first surface 110-1. The first surface 110-1 may be referred to as a top surface of the base layer 110A, and the second surface 110-2 may be referred to as a bottom surface of the base layer 110A.

A plurality of pads PDb may be disposed in a hole 110-H defined in the base layer 110A and open to outside the base layer 110A at both the first surface 110-1 and the second surface 110-2 (e.g., a through hole). In other words, each of the plurality of pads PDb may be disposed in the hole 110-H and may be electrically connected to the line group LC included in the circuit layer 120. The circuit film COF may be disposed under the base layer 110A to be electrically connected to the plurality of pads PDb.

FIG. 12 shows the pad PDb extending out of the base layer 110A to define an extended portion of the pad PDb which meet the line group LC of the circuit layer 120, within a thickness of the circuit layer 120. In contrast, in FIG. 7A, for example, the line group LC extends out of the circuit layer 120 to define an extended portion of the line group LC which meets the conductive layer MTL within a thickness of the base layer 110. For either embodiment, each of the pad PD and the line group LC has an exposed portion thereof, which is exposed outside the base layer 110 and the circuit layer 120, respectively.

Figure 13:
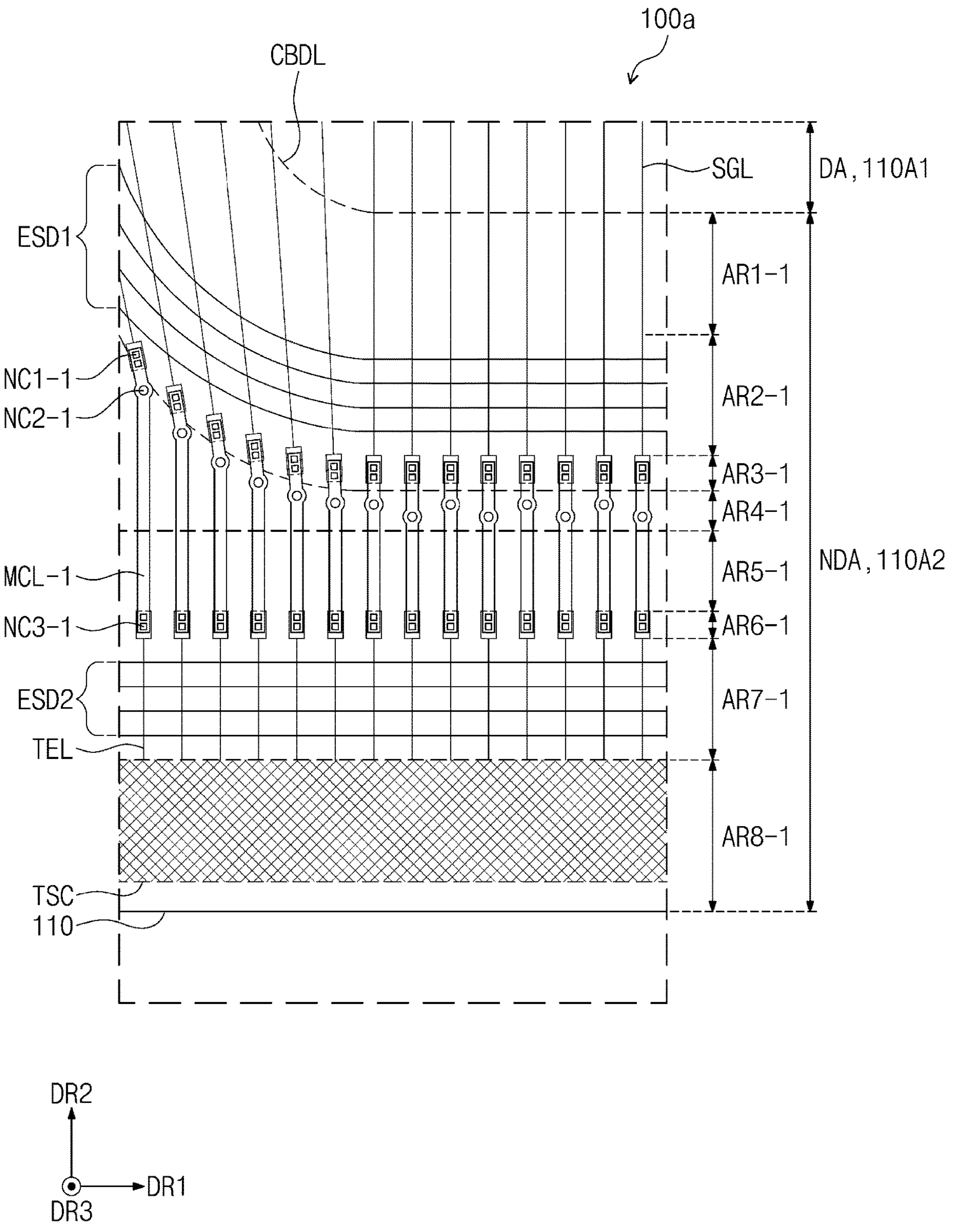
FIG. 13 is an enlarged plan view of a portion of a display panel, according to an embodiment of the present disclosure.

FIG. 13 is an enlarged plan view of a portion of a display panel 100*a*, according to an embodiment of the present disclosure.

Referring to FIG. 13, the non-display region NDA may include first to eighth non-display regions AR1-1, AR2-1, AR3-1, AR4-1, AR5-1, AR6-1, AR7-1, and AR8-1 sequentially defined in a direction away from a boundary CBDL of the display region DA. A portion of the boundary CBDL may have a curved line. Each of the display region DA, the non-display region NDA and the first to fourth non-display regions AR1-1, AR2-1, AR3-1 and AR4-1 may have a curved area, and the curved areas may correspond to each other.

A plurality of first connection lines MCL-1 may be disposed in third to sixth non-display regions AR3-1, AR4-1, AR5-1, and AR6-1 The plurality of first connection lines MCL-1 may be spaced apart from each other in the first direction DR1. The plurality of first connection lines MCL-1 may be connected to the plurality of lines SGL, respectively. For example, the plurality of first connection lines MCL-1 and the plurality of lines SGL may be connected to each other through a first contact part NC1-1 in the third non-display region AR3-1.

The first connection lines MCL-1 may include second contact parts NC2-1 disposed in the fourth non-display region AR4-1. The first connection lines MCL-1 may be electrically connected to the plurality of pads PDc (see FIG. 14) through the second contact parts NC2-1 in the fourth non-display region AR4-1. The second contact parts NC2-1 may be arranged in along a profile or an extending direction of the boundary CBDL defined between the non-display region NDA and the display region DA.

The display panel 100*a* which is uncut or unbent (e.g., flat) may define a preliminary display panel. The first connection lines MCL-1 may be disposed extending into the fifth non-display region AR5-1 from the fourth non-display region AR4-1. After testing of the display panel 100*a* has been finished, when a portion of the display panel 100*a* having the test circuit TSC is removed, the fifth non-display region AR5-1 may be cut out from a remainder of the preliminary display panel. Alternatively, the fifth non-display region AR5-1 may be a region of the preliminary display panel which is bent and folded such that the portion of the display panel 100*a* having the test circuit TSC is disposed under another portion of the display panel 100*a*. Alternatively, the fifth non-display region AR5-1 may be referred to as a cutting region or a folding region FIA (see FIG. 7B).

The additional connection lines TEL may be disposed in the sixth and seventh non-display regions AR6-1 and AR7-1. For example, the plurality of first connection lines MCL-1 and the additional connection lines TEL may be connected to each other through a third contact part NC3-1 in the sixth non-display region AR6-1.

The test circuit TSC may be disposed in the eighth non-display region AR8-1. The test circuit TSC may be electrically connected to the plurality of lines SGL through the additional connection lines TEL and the first connection lines MCL-1.

Figure 14:
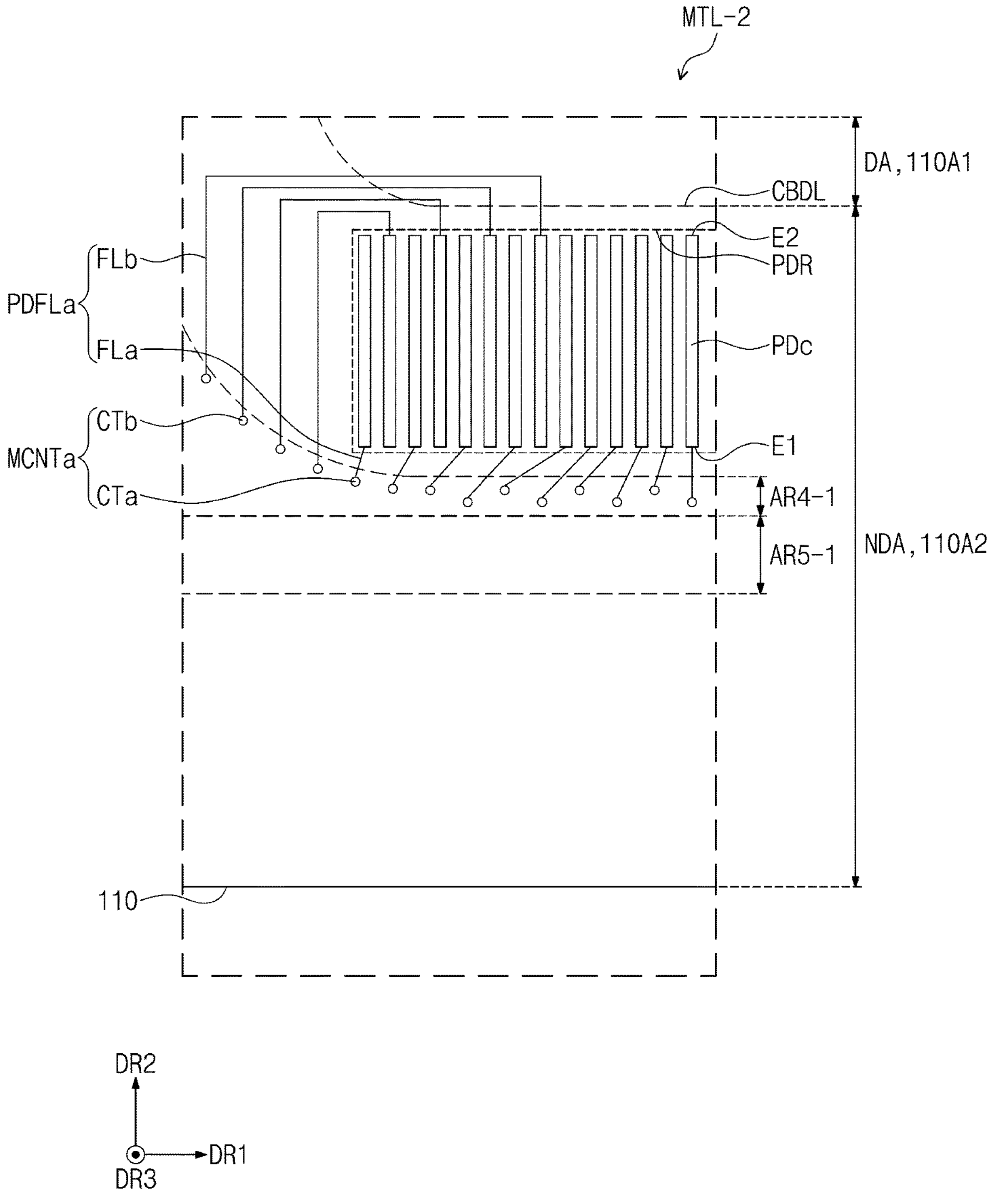
FIG. 14 is a plan view illustrating a conductive layer corresponding to a portion of the display panel of FIG. 13.

FIG. 14 is a plan view illustrating a conductive layer MTL-2 corresponding to a portion of the display panel 100*a* of FIG. 13.

Referring to FIGS. 13 and 14, the conductive layer MTL-2 may include the plurality of pads PDc, a plurality of second connection lines PDFLa, and a plurality of contact parts MCNTa. The conductive layer MTL-2 illustrated in FIG. 13 may be disposed between the first sub-base layer 111 and the second sub-base layer 112, as described above with reference to FIGS. 7A, 7B, 7C, 8, 9, and 10.

The plurality of pads PDc may be arranged in the first direction DR1, and each of the plurality of pads PDc may include a first end E1 and a second end E2 spaced apart from each other in the second direction DR2 crossing the first direction DR1. When viewed from a plan view, the first end E1 may be further away from the first region 110A1 and the display region DA, than the second end E2.

First sub-connection lines FLa of the plurality of second connection lines PDFLa may protrude while extending from the first end E1 of a first pad among the plurality of pads PDc, and second sub-connection lines FLb of the plurality of second connection lines PDFLa may extend from the second end E2 of a second pad among the plurality of pads PDc. A first group of pads among the plurality of pads PDc may be furthest from a center of the collection of the plurality of pads PDc along the first direction DR1, while a second group of pads among the plurality of pads PDc may be closer to or disposed at the center of the collection of the plurality of pads PDc along the first direction DR1. Within the first group of pads (e.g., outermost pads), the first pads and the second pads may be alternated with each other, while within the second group of pads, the first pads consecutively arranged along the first direction DR1.

The contact parts MCNTa to make contact with the plurality of first connection lines MCL-1 may be connected to distal ends of the second connection lines PDFLa, and may make contact with the second contact parts NC2-1 of the first connection lines MCL-1.

The contact parts MCNTa may include first contact parts CTa spaced apart in the second direction DR2 from the region PDR for the plurality of pads PDc and second contact parts CTb spaced apart in the first direction DR1 from the region PDR for the plurality of pads PDc. The first contact parts CTa may be connected to some first sub-connection lines FLa, and the second contact parts CTb may be connected to remaining second sub-connection lines FLb, respectively.

According to an embodiment of the present disclosure, the second connection lines PDFLa and the plurality of pads PDc may be disposed to be closer to the display region DA than the contact parts MCNTa, along a radial direction from the boundary CBDL. Accordingly, a cutting line or a folding line of the display panel 100*a* may be provided to be adjacent to the contact parts MCNTa without considering an area of a region PDR for the plurality of pads PDc. Accordingly, the display device 1000 (see FIG. 1) having the non-display region 1000NA (see FIG. 1) further reduced in area may be provided.

As described above, the circuit film COF may be coupled to a rear surface of the display panel 100 or 100*a*. The test circuit TSC may be disposed at a location away from the display region DA and farther from the display region DA than the pads PD, PDa, PDb or PDc connected to the circuit film COF. Accordingly, when testing of the display panel 100 or 100*a* is finished by using the test circuit TSC, the test circuit TSC may be removed from a planar area of the final form of the display panel 100 or 100*a*. As being removed from the planar area of the final form of the display panel 100 or 100*a*, a portion of a preliminary display panel may be separated from a remainder of the preliminary display panel (e.g., cut). Alternatively, the preliminary display panel may be bent or folded at a region between the test circuit TSC and the pads PD, PDa, PDb or PDc, such that a portion of the display panel 100 or 100*a* corresponding to the test circuit TSC remaining in the final form of the display panel 100 or 100*a* may be disposed under another portion of the display panel 100 or 100*a* along the thickness direction. Accordingly, a planar area of the non-display region NDA which includes the test circuit TSC, may be removed from a final form of the display panel 100 or 100*a* (e.g., the display panel 100 or 100*a* from which a portion is separated by cutting or the display panel 100 or 100*a* which includes the portion but the portion overlaps the display region DA of the display panel 100 or 100*a*. Accordingly, the display device 1000 including the non-display region 1000NA having the reduced area may be provided.

Although an embodiment of the present disclosure has been described for illustrative purposes, those skilled in the art will appreciate that various modifications, and substitutions are possible, without departing from the scope and spirit of the invention as disclosed in the accompanying claims. Accordingly, the technical scope of the invention is not limited to the detailed description of this specification, but should be defined by the claims.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display panel comprising:

a base layer including a first region, and a second region which is adjacent to the first region;

a pixel disposed on the first region of the base layer;

a line electrically connected to the pixel and extending from the first region to the second region;

a pad electrically connected to the line, at which an electrical signal is input to the display panel from outside thereof and disposed under a top surface of the base layer;

a test circuit on the base layer, in the second region, the test circuit being spaced apart from the first region and further from the first region than the pad; and a first connection line electrically connected to the line, and extending from the line, in a direction away from the first region and toward the test circuit, the first connection line extending in a thickness direction of the base layer to be electrically connected to the pad.

2. The display panel of claim 1, wherein the base layer includes:

a first sub-base layer;

a second sub-base layer facing the first sub-base layer; and a conductive layer extended along and between the first sub-base layer and the second sub-base layer which face each other.

3. The display panel of claim 2, wherein the first connection line extends through a thickness of the second sub-base layer to be electrically connected to the conductive layer of the base layer.

4. The display panel of claim 3, wherein the conductive layer defines the pad, and the first connection line which extends through the thickness of the second sub-base layer is electrically connected to the conductive layer at the pad.

5. The display panel of claim 4, wherein the first connection line which extends through the thickness of the second sub-base layer directly contacts the pad to be electrically connected to the conductive layer at the pad.

6. The display panel of claim 3, wherein the conductive layer defines in order in the direction away from the first region and toward the test circuit:

the pad;

a second connection line extended from the pad; and a contact part extended from the second connection line, and the first connection line which extends through the thickness of the second sub-base layer is electrically connected to the conductive layer at the contact part.

7. The display panel of claim 6, wherein the pad is provided in plural including a plurality of pads arranged along a first direction, each of the plurality of pads includes a first end and a second end spaced apart from each other along a second direction crossing the first direction, and the second connection line is provided in plural including a plurality of second connection lines respectively extending from the first ends of the plurality of pads.

8. The display panel of claim 6, wherein the pad is provided in plural including a plurality of pads arranged along a first direction, each of the plurality of pads includes a first end and a second end spaced apart from each other along a second direction crossing the first direction, and the second connection line is provided in plural including a plurality of second connection lines including:

first sub-connection lines respectively extending from the first ends of first pads among the plurality of pads; and second sub-connection lines respectively extending from the second ends of second pads among the plurality of pads.

9. The display panel of claim 8, wherein the first end is further from the first region than the second end, along the second direction, the plurality of pads includes an outermost pad along the first direction, the first connection line is provided in plural including a plurality of first connection lines, the conductive layer defines the contact part provided in plural including a plurality of contact parts respectively extended from the second sub-connection lines, the plurality of first connection lines being respectively connected to the conductive layer at the plurality of contact parts, and the plurality of contact parts are spaced apart from the outermost pad along the first direction.

10. The display panel of claim 1, wherein the pad is in the second region.

11. The display panel of claim 1, further comprising:

an encapsulating layer covering the pixel, the encapsulating layer defining an end of the encapsulating layer which is closest to the second region, wherein the pad overlaps the end of the encapsulating layer.

12. The display panel of claim 1, wherein the pad is disposed in the first region, and wherein the pad is overlapped with the pixel, when viewed from a plan view.

13. The display panel of claim 1, further comprising within the second region:

a first electrostatic discharge protection circuit between the first region and the test circuit;

a contact area at which the line is electrically connected to the pad, the contact area between the first electrostatic discharge protection circuit and the test circuit; and a second electrostatic discharge protection circuit between the contact area and the test circuit.

14. A display panel comprising:

a base layer including:

a first surface and a second surface which is opposite to the first surface, and a first region and a second region which is adjacent to the first region, the base layer defining a through hole in the second region, a pixel disposed on the first region of the base layer:

a line on the first surface of the base layer, electrically connected to the pixel and extending from the first region to the second region, a pad which is under the first surface of the base layer and in the through hole of the base layer, the pad electrically connected to the line at the through hole, a contact part electrically connected to the line and the pad; and a test extension line extending from the contact part in a direction away from the first region.

15. A display device comprising:

a display panel comprising:

a base layer including a first region, and a second region which is adjacent to the first region, a pixel disposed on the first region of the base layer;

a line disposed on a top surface of the base layer, electrically connected to the pixel and extending from the first region to the second region, and a pad disposed under the top surface of the base layer and electrically connected to the line at a contact area;

a contact part electrically connected to the line and the pad; and a test extension line extending from the contact part in a direction away from the first region;

a circuit film electrically connected to the display panel, at the pad, wherein the circuit film is disposed under the base layer and coupled to the pad.

16. The display device of claim 15, wherein the display panel further includes:

a test circuit on the base layer, in the second region, and electrically connected to the test extension line; and a folding region at which the display panel is foldable, the folding region between the contact area and the test circuit and including the test extension line.

17. The display device of claim 15, wherein the base layer includes:

a first sub-base layer;

a second sub-base layer facing the first sub-base layer; and a conductive layer extended along and between the first sub-base layer and the second sub-base layer which face each other, the conductive layer defining the pad, the display panel further includes a first connection line electrically connected to the line, and extending from the line in the direction away from the first region, and the first connection line extends through a thickness of the second sub-base layer to be electrically connected to the pad which is defined by the conductive layer of the base layer.

18. The display device of claim 17, wherein the conductive layer further includes a second connection line electrically connected to and extended from the pad, and the second connection line contacts the first connection line to define the contact area.

19. The display device of claim 17, wherein the pad is at least partially overlapped with the first region.

20. The display device of claim 17, wherein an end of the base layer is aligned with an end of the test extension line.

* * * * *